(12) United States Patent
Wang

(10) Patent No.: US 11,047,407 B2
(45) Date of Patent: *Jun. 29, 2021

(54) QUICK RELEASE CONNECTING DEVICE

(71) Applicant: Ting-Jui Wang, New Taipei (TW)

(72) Inventor: Ting-Jui Wang, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/681,972

(22) Filed: Nov. 13, 2019

(65) Prior Publication Data

US 2020/0080578 A1    Mar. 12, 2020

Related U.S. Application Data

(63) Continuation-in-part of application No. 16/224,841, filed on Dec. 19, 2018, now Pat. No. 10,686,268.

(30) Foreign Application Priority Data

Dec. 22, 2017  (CN) .......................... 201711400169.6

(51) Int. Cl.
*H05K 7/14*  (2006.01)
*F16B 2/04*  (2006.01)
(Continued)

(52) U.S. Cl.
CPC ................ *F16B 2/04* (2013.01); *F16B 2/185* (2013.01); *H05K 7/1409* (2013.01); *E05B 65/46* (2013.01)

(58) Field of Classification Search
CPC . H01R 12/7058; H05K 2/1409; H05K 7/1405
(Continued)

(56) References Cited

U.S. PATENT DOCUMENTS 3,746,931 A * 7/1973 Muranaka ............ G01D 11/305
174/503
4,002,381 A    1/1977 Wagner
(Continued)

FOREIGN PATENT DOCUMENTS

CN    201162743 Y    12/2008
CN    102678711 A    9/2012
(Continued)

OTHER PUBLICATIONS

Non-Final Office Action dated Jul. 29, 2019 for U.S. Appl. No. 16/224,841.

*Primary Examiner* — Neil Abrams
(74) *Attorney, Agent, or Firm* — Schmeiser, Olsen & Watts LLP

(57) ABSTRACT

A quick release connecting device includes an actuating retainer and a fixing member movably assembled to the actuating retainer. The fixing member includes a pivot portion and a pivot member movably mounted to the pivot portion; and the pivot member is coupled with a second object. The fixing member includes a limiting section and the pivot member includes a corresponding limiting section, such that the limiting section and the corresponding limiting section limit or stop each other at a specific location when the fixing member is moved or rotated. With these arrangements, the quick release connecting device can be applied to conveniently and repeatedly connect and separate a circuit board, a drawer, or a window to and from a corresponding rack, chassis, cabinet or window frame.

11 Claims, 22 Drawing Sheets

(51) Int. Cl.
*F16B 2/18* (2006.01)
*E05B 65/46* (2017.01)

(58) Field of Classification Search
USPC .......................................................... 439/160
See application file for complete search history.

(56) References Cited

U.S. PATENT DOCUMENTS

| | | | |
|---|---|---|---|
| 4,301,494 A | 11/1981 | Jordan | |
| 4,403,102 A | 9/1983 | Jordan | |
| 4,596,907 A * | 6/1986 | LaGreco | H05K 7/1414 |
| | | | 200/292 |
| 5,139,430 A | 8/1992 | Lewis | |
| 5,414,594 A * | 5/1995 | Hristake | H05K 7/1409 |
| | | | 361/755 |
| 6,381,146 B1 | 4/2002 | Sevier | |
| 6,579,029 B1 * | 6/2003 | Sevde | H05K 7/1409 |
| | | | 403/321 |
| 6,582,241 B1 | 6/2003 | Lutz, Jr. | |
| 6,648,667 B2 | 11/2003 | Heidenreich | |
| 6,878,006 B1 | 4/2005 | Heidenreich | |
| 6,955,550 B2 * | 10/2005 | Schlack | H05K 7/1409 |
| | | | 439/157 |
| 6,956,745 B2 * | 10/2005 | Kerrigan | H05K 7/1487 |
| | | | 312/223.1 |
| 7,027,309 B2 * | 4/2006 | Franz | H01R 13/62933 |
| | | | 361/732 |
| 7,172,441 B2 * | 2/2007 | Schlack | H01R 13/633 |
| | | | 439/152 |
| 7,203,067 B2 * | 4/2007 | Beall | H05K 7/1409 |
| | | | 361/726 |
| 7,284,997 B2 | 10/2007 | Joist | |
| 7,297,008 B2 * | 11/2007 | Griffin | H05K 7/1409 |
| | | | 439/157 |
| 7,301,778 B1 | 11/2007 | Fang | |
| 7,749,006 B2 * | 7/2010 | Chiang | H05K 7/1409 |
| | | | 439/160 |
| 8,638,563 B2 * | 1/2014 | Peng | G11B 33/124 |
| | | | 361/740 |
| 8,811,026 B2 * | 8/2014 | Engelvin | H05K 7/1409 |
| | | | 361/759 |
| 9,093,830 B2 | 7/2015 | Krieg | |
| 9,992,896 B2 * | 6/2018 | Fordham | G06F 1/186 |
| 10,070,549 B2 * | 9/2018 | Su | H05K 7/1409 |
| 10,117,350 B2 * | 10/2018 | Kuang | H05K 7/1409 |
| 10,686,268 B2 * | 6/2020 | Wang | H01R 12/7058 |
| 2004/0025295 A1 | 2/2004 | Becker | |

FOREIGN PATENT DOCUMENTS

| | | |
|---|---|---|
| CN | 104976191 A | 10/2015 |
| CN | 106594034 A | 4/2017 |
| JP | H1125941 A | 1/1999 |
| TW | I550194 B | 9/2016 |

* cited by examiner (a)

(b)

(c)

(d)

(e)

QUICK RELEASE CONNECTING DEVICE

CROSS-REFERENCE TO RELATED APPLICATION

This application is a continuation-in-part patent application of U.S. application Ser. No. 16/224,841 filed on Dec. 19, 2018, the entire contents of which are hereby incorporated by reference for which priority is claimed under 35 U.S.C.

BACKGROUND OF THE INVENTION

1. Field of the Invention

The present invention relates to a quick release connecting device, and more particularly, to a quick release connecting device that enables convenient and repeated assembling and separation of a circuit board, a drawer, or a window to and from a corresponding rack, chassis, cabinet or window frame.

2. Description of the Related Art

To enable convenient assembling and fastening of a circuit board to a rack, and to enable easy disassembling of the circuit board from the rack when necessary, a quick release mechanism is usually provided on the circuit board or the rack. Various types of quick release mechanisms are known, and each type of circuit board has a corresponding quick release mechanism designed for it. To enable two mating objects, such as the circuit board and the rack, to be repeatedly assembled to and separated from each other in a quick and convenient manner, it is desirable to develop an improved quick release connecting device that includes means to assist in pushing away a first one of the two mating objects, so that the second object can be easily pulled out of the first object.

BRIEF SUMMARY OF THE INVENTION

In view that the prior art quick release mechanisms are not perfect for use, it is tried by the inventor to develop an improved quick release connecting device to enable convenient and repeated assembling and separation of a circuit board, a drawer, a window, etc. to and from a corresponding rack, chassis, cabinet, window frame, etc.

A primary object of the present invention is to provide a quick release connecting device that includes an actuating retainer and a fixing member limitedly movably assembled to each other, so that a second object, such as a circuit board, a drawer or a window, detachably connected to a first object, such as a rack, a chassis, a cabinet or a window frame, via the actuating retainer and the fixing member can be conveniently and repeatedly assembled to and separated from each other.

To achieve the above and other objects, the quick release connecting device according to a preferred embodiment of the present invention includes an actuating retainer having an internal receiving space and a retaining section for detachably engaging with a first object; a fixing member including a body portion movably associated with the receiving space and a pivot portion formed on the body portion for detachably connecting with a second object; and pin connection means connecting the body portion to the receiving space for the actuating retainer and the fixing member to move relative to each other within a limited range. Or, according to another operable embodiment, the actuating retainer includes at least one first push section, a body portion, and a retaining section for detachably engaging with a first object; the fixing member internally defines a receiving space and includes a pivot portion formed on an outer side of the receiving space; the body portion of the actuating retainer is movably received in the receiving space of the fixing member, and the pivot portion is used to movably connect to a second object; and the pin connection means enables connection of the receiving space of the fixing member to the body portion of the actuating retainer, such that the actuating retainer and the fixing member are movable relative to each other within a limited range. Further, the fixing member includes a second push section having a first push part or a second push part; the first push part or the second push part is able to push against a third object; and the push of the second push section against the third object causes a lever displacement, a rotational displacement, or a limiting displacement of the quick release connecting device, so as to release, fasten, forward move or backward move the quick release connecting device.

To achieve the above and other objects, the quick release connecting device according to another preferred embodiment of the present invention includes an actuating retainer and a fixing member movably assembled to the actuating retainer. The fixing member includes a pivot portion and a pivot member movably mounted to the pivot portion; and the pivot member is coupled with a second object.

In the quick release connecting device according to the other preferred embodiment of the present invention, the fixing member can include a limiting section and the pivot member can include a corresponding limiting section, such that the limiting section and the corresponding limiting section limit or stop each other at a specific location when the fixing member is moved or rotated.

In the quick release connecting device according to the other preferred embodiment of the present invention, the pivot member or the pivot portion can include a shaft. The shaft can be movably assembled to the pivot member or the pivot portion, integrally formed with the pivot member or the pivot portion, or fixedly assembled to the pivot member or the pivot portion. And, the pivot member, the pivot portion or the fixing member is connected to the shaft via a second pin connection means in the case the shaft is assembled to the pivot member or the pivot portion.

In the quick release connecting device according to the other preferred embodiment of the present invention, the fixing member, the pivot portion or the pivot member can have an elastic element fitted thereon. Two ends of the elastic element are separately pressed against the pivot member and the fixing member of the quick release connecting device or separately pressed against the fixing member of the quick release connecting device and the second object, such that the fixing member under a spring force of the elastic element is either automatically sprung back to its original position or limited to a fixed position.

In the quick release connecting device according to the other preferred embodiment of the present invention, the fixing member can include a limiting section and the second object can include a corresponding limiting section, such that the limiting section and the corresponding limiting section limit or stop each other at a specific location when the fixing member is moved or rotated.

In the quick release connecting device according to the other preferred embodiment of the present invention, the pivot member can have a weldable surface, which can be heated and welded to the second object.

In the quick release connecting device according to the other preferred embodiment of the present invention, the pivot member can have a portion that is deformable under an external force applied thereto, so that the deformed portion of the pivot member is abutted on or interfered with the second object.

In the quick release connecting device according to the other preferred embodiment of the present invention, an elastic member, a friction-increasing member or a friction-decreasing member can be further provided. The elastic member, the friction-increasing member or the friction-decreasing member can be disposed between the fixing member and the pivot portion, between the fixing member and the pivot member, between the pivot portion and the second object, between the pivot portion and the pivot member, between pivot member and the second object, or between the fixing member and the second object.

To achieve the above and other objects, the quick release connecting device according to a further preferred embodiment of the present invention includes an actuating retainer and a fixing member movably assembled to the actuating retainer. The fixing member includes a pivot portion and a pivot member movably mounted to the pivot portion; and the pivot member is coupled with a second object. The pivot portion or the pivot member includes a shaft, and the shaft can be movably assembled to the pivot member or the pivot portion, integrally formed with the pivot member or the pivot portion, or fixedly assembled to the pivot member or the pivot portion.

In the quick release connecting device according to the further preferred embodiment of the present invention, the fixing member can include a limiting section and the pivot member can include a corresponding limiting section; such that the limiting section and the corresponding limiting section limit or stop each other at a specific location when the fixing member is moved or rotated.

In the quick release connecting device according to the further preferred embodiment of the present invention, the pivot member, the pivot portion or the fixing member can be connected to the shaft via a second pin connection means in the case the shaft is assembled to the pivot member or the pivot portion.

In the quick release connecting device according to the further preferred embodiment of the present invention, the fixing member, the pivot portion or the pivot member can have an elastic element fitted thereon. Two ends of the elastic element are separately pressed against the pivot member and the fixing member of the quick release connecting device or separately pressed against the fixing member of the quick release connecting device and the second object, such that the fixing member under a spring force of the elastic element is either automatically sprung back to its original position or limited to a fixed position.

In the quick release connecting device according to the further preferred embodiment of the present invention, the fixing member can include a limiting section and the second object can include a corresponding limiting section, such that the limiting section and the corresponding limiting section limit or stop each other at a specific location when the fixing member is moved or rotated.

In the quick release connecting device according to the further preferred embodiment of the present invention, the pivot member can have a weldable surface, which can be heated and welded to the second object.

In the quick release connecting device according to the further preferred embodiment of the present invention, the pivot member can have a portion that is deformable under an external force applied thereto, so that the deformed portion of the pivot member is abutted on or interfered with the second object.

In the quick release connecting device according to the further preferred embodiment of the present invention, an elastic member, a friction-increasing member or a friction-decreasing member can be further provided. The elastic member, the friction-increasing member or the friction-decreasing member can be disposed between the fixing member and the pivot portion, between the fixing member and the pivot member, between the pivot portion and the second object, between the pivot portion and the pivot member, between pivot member and the second object, or between the fixing member and the second object.

To achieve the above and other objects, the quick release connecting device according to a still further preferred embodiment of the present invention includes an actuating retainer and a fixing member movably assembled to the actuating retainer. The fixing member includes a pivot portion and a pivot member movably mounted to the pivot portion. A floating amount is allowable between the quick release connecting device and the second object, between the pivot portion and the pivot member, between the fixing member and the second object, between the fixing member and the pivot member, or between different angular positions of the fixing member.

In the quick release connecting device according to the still further preferred embodiment of the present invention, the fixing member can include a limiting section and the pivot member can include a corresponding limiting section, such that the limiting section and the corresponding limiting section limit or stop each other at a specific location when the fixing member is moved or rotated.

In the quick release connecting device according to the still further preferred embodiment of the present invention, the pivot member or the pivot portion can include a shaft. The shaft can be movably assembled to the pivot member or the pivot portion, integrally formed with the pivot member or the pivot portion, or fixedly assembled to the pivot member or the pivot portion. And, the pivot member, the pivot portion or the fixing member can be connected to the shaft via a second pin connection means in the case the shaft is assembled to the pivot member or the pivot portion.

In the quick release connecting device according to the still further preferred embodiment of the present invention, the fixing member, the pivot portion or the pivot member can have an elastic element fitted thereon. Two ends of the elastic element are separately pressed against the pivot member and the fixing member of the quick release connecting device or separately pressed against the fixing member of the quick release connecting device and the second object, such that the fixing member under a spring force of the elastic element is either automatically sprung back to its original position or limited to a fixed position.

In the quick release connecting device according to the still further preferred embodiment of the present invention, the pivot portion or the pivot member can include a shaft, and the shaft can be movably assembled to the pivot portion or the pivot member, integrally formed with the pivot portion or the pivot member, or fixedly assembled to the pivot member or the pivot portion.

In the quick release connecting device according to the still further preferred embodiment of the present invention, the fixing member can include a limiting section and the second object can include a corresponding limiting section, such that the limiting section and the corresponding limiting section limit or stop each other at a specific location when the fixing member is moved or rotated.

In the quick release connecting device according to the still further preferred embodiment of the present invention, the pivot member can have a weldable surface, which can be heated and welded to the second object.

In the quick release connecting device according to the still further preferred embodiment of the present invention, the pivot member can have a portion that is deformable under an external force applied thereto, so that the deformed portion of the pivot member is abutted on or interfered with the second object.

In the quick release connecting device according to the still further preferred embodiment of the present invention, an elastic member, a friction-increasing member or a friction-decreasing member can be further provided. The elastic member, the friction-increasing member or the friction-decreasing member can be disposed between the fixing member and the pivot portion, between the fixing member and the pivot member, between the pivot portion and the second object, between the pivot portion and the pivot member, between pivot member and the second object, or between the fixing member and the second object.

In the quick release connecting device according to the still further preferred embodiment of the present invention, the floating amount allowable between the quick release connecting device and the second object, between the pivot portion and the pivot member, between the fixing member and the second object, between the fixing member and the pivot member, or between different angular positions of the fixing member can be a vertically pivotal floating amount.

In the quick release connecting device according to the still further preferred embodiment of the present invention, the floating amount allowable between the quick release connecting device and the second object, between the pivot portion and the pivot member, between the fixing member and the second object, between the fixing member and the pivot member, or between different angular positions of the fixing member can be a horizontally pivotal floating amount.

In the quick release connecting device according to the still further preferred embodiment of the present invention, the floating amount allowable between the quick release connecting device and the second object, between the pivot portion and the pivot member, between the fixing member and the second object, between the fixing member and the pivot member, or between different angular positions of the fixing member can be a vertically linear floating amount.

In the quick release connecting device according to the still further preferred embodiment of the present invention, the floating amount allowable between the quick release connecting device and the second object, between the pivot portion and the pivot member, between the fixing member and the second object, between the fixing member and the pivot member, or between different angular positions of the fixing member can be a horizontally linear floating amount.

To use the quick release connecting device of the present invention, first movably connect the pivot portion of the fixing member to the second object, such as a circuit board, a drawer or a window. Since the actuating retainer and the fixing member are movably assembled to each other, at least one of them can be quickly detachably engaged with at least a first object, such as a chassis, a rack, a cabinet or a window frame. More specifically, the retaining section of the actuating retainer and/or the second push section of the fixing member can be quickly detachably engaged with the first object to thereby quickly connect the second object to the first object. On the other hand, to separate the second object from the first object, simply push the first push section for the retaining section to disengage from the first object and pivotally turn the fixing member for the second push section to push away the first object, and the second object is easily separated from the first object. Therefore, with the quick release connecting device of the present invention, the second object can be repeatedly quickly assembled to and separated from the first object.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE INVENTION

Figure 1:
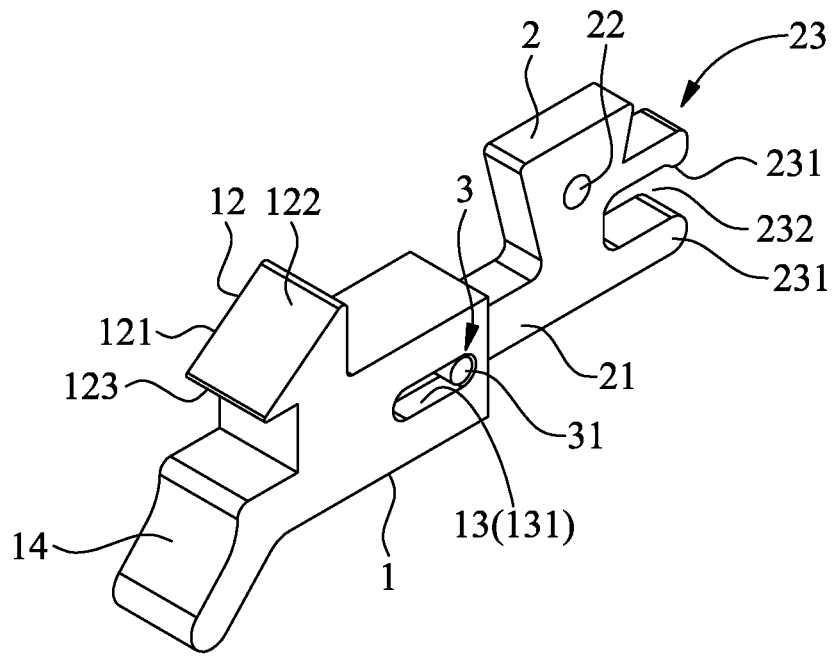
FIG. 1 is an assembled perspective view of a quick release connecting device according to a first preferred embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 10:
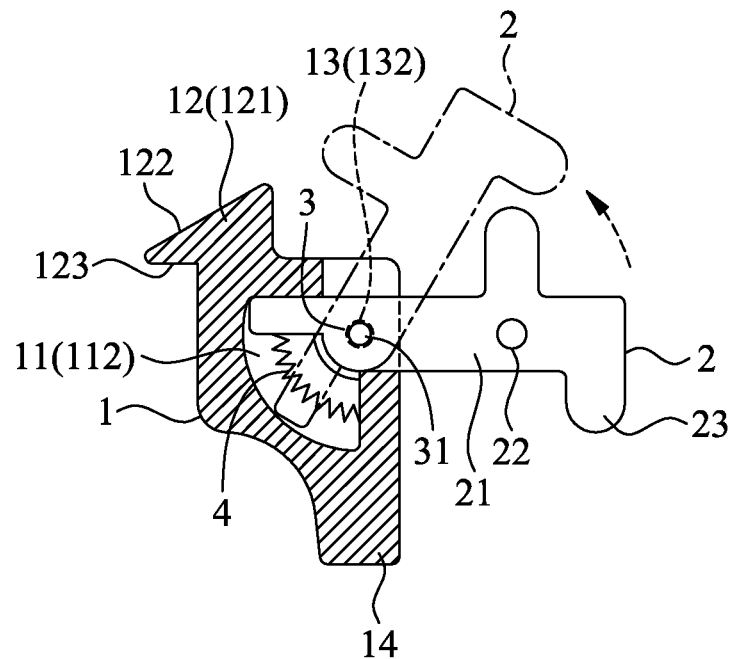
FIG. 10 is an assembled partially sectioned front view of a quick release connecting device according to a second preferred embodiment of the present invention.
Figure 11:
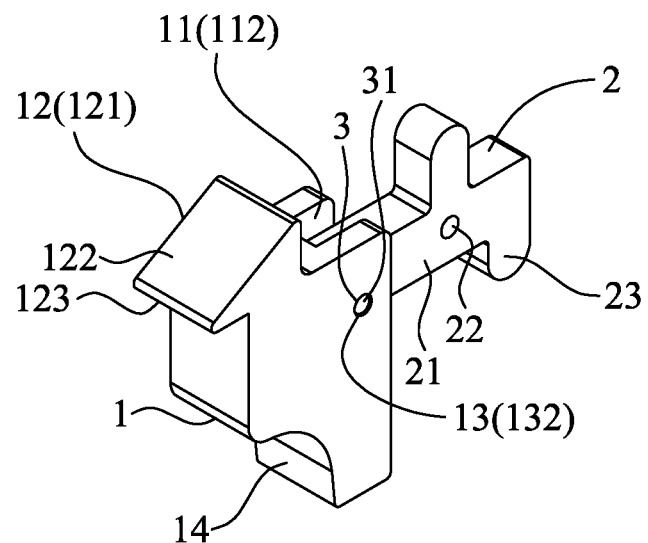
FIG. 11 is an assembled perspective view of the quick release connecting device according to the second preferred embodiment of the present invention.
Figure 12:
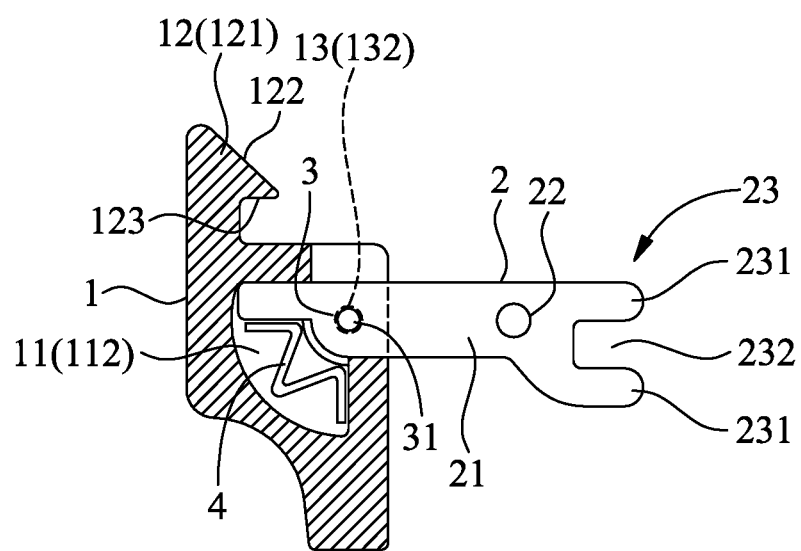
FIG. 12 is an assembled partially sectioned front view of a variant of the second preferred embodiment of the present invention, showing an elastic plate and a different retaining section are included in the quick release connecting device.
Figure 13A:
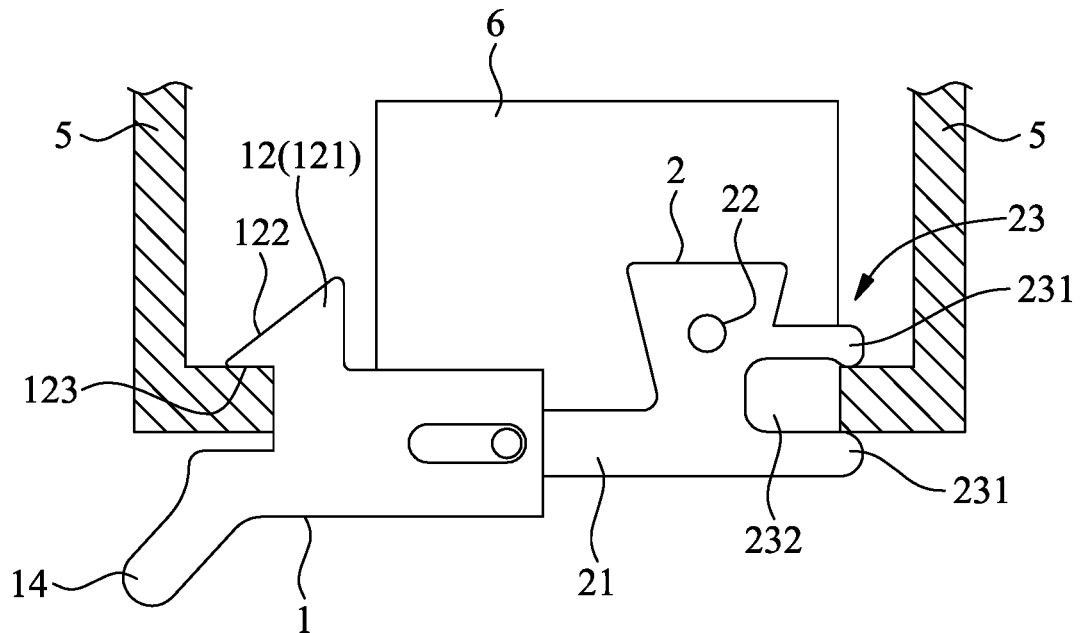
FIG. 13A shows the quick release connecting device according to the first preferred embodiment of the present invention is connected to two objects and can be operated to quickly release the two objects from each other.
Figure 13B:
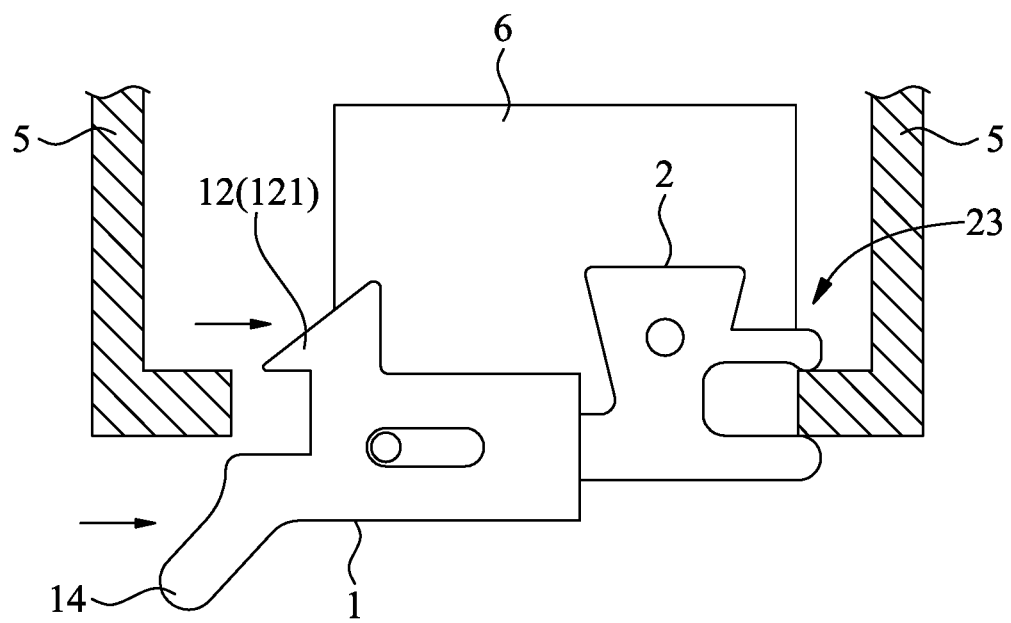
FIG. 13B shows the quick release connecting device according to the first preferred embodiment of the present invention is connected to two objects and can be operated to quickly release the two objects from each other.

FIGS. 1 to 9 show a quick release connecting device according to a first preferred embodiment of the present invention, which is configured to enable limited slide, i.e. to slide within a limited range; and FIGS. 10 to 12 show a quick release connecting device according to a second preferred embodiment of the present invention, which is configured to enable limited rotation, i.e. to rotate within a limited angle. As shown, in both of the first and second preferred embodiments, the quick release connecting device of the present invention includes an actuating retainer 1 and a fixing member 2 movably assembled to the actuating retainer 1. The actuating retainer 1 can be made of a plastic material or a metal material; it internally defines a receiving space 11 and includes a retaining section 12 for detachably engaging with a first object 5 and at least one first push section 14. The fixing member 2 can be made of a plastic material or a metal material; it includes a body portion 21 and a pivot portion 22 formed on an outer end of the body portion 21. The body portion 21 has an inner end movably associated with the receiving space 11 of the actuating retainer 1; and the pivot portion 22 is located outside the receiving space 11 for detachably connecting with a second object 6. The first push section 14 can be a protrusion outward projected from any side of the actuating retainer 1. As shown in FIG. 13B, by applying a force against the first push section 14, the actuating retainer 1 can be moved to release the retaining section 12 from the first object 5, allowing the second object 6 to separate from the first object 5. The quick release connecting device according to the first and the second preferred embodiment of the present invention further include pin connection means 3. The pin connection means 3 enables connection of the body portion 21 of the fixing member 2 to the receiving space 11 of the actuating retainer 1, such that the actuating retainer 1 and the fixing member 2 in the first and the second preferred embodiment are slidable and rotatable, respectively, relative to each other within a limited range and angle. The quick release connecting device according to the first and the second preferred embodiment of the present invention can further include an elastic element 4, which is disposed in the receiving space 11 of the actuating retainer 1, or can be disposed at a selected position, with an end pressed against an inner wall surface of the receiving space 11 and another opposite end against the body portion 21 of the fixing member 2. The elastic element 4 enables and controls limited sliding or rotation of the actuating retainer 1 and the fixing member 2 relative to each other, and can elastically push the actuating retainer 1 and the fixing member 2 back to their original positions.

Figure 5:
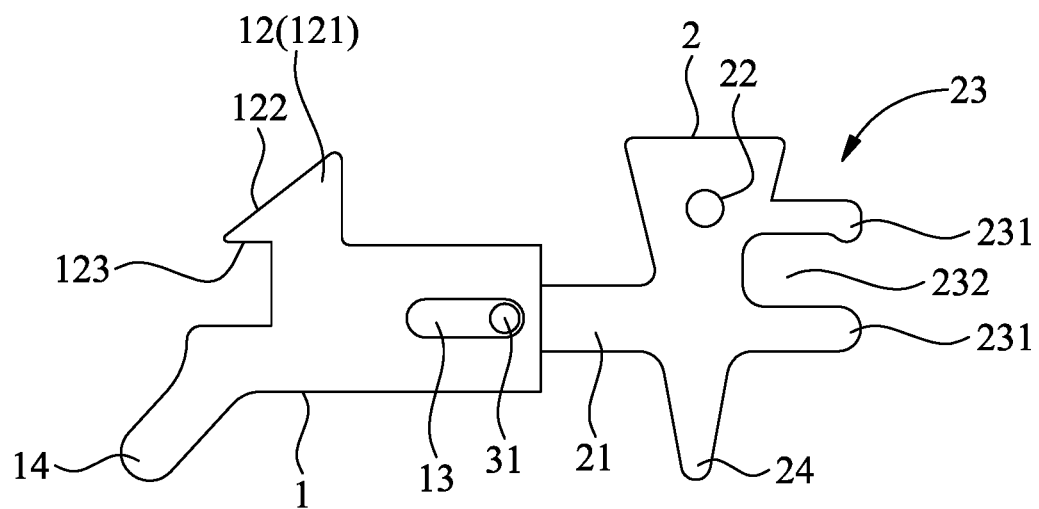
FIG. 5 is an assembled front view of a first variant of the quick release connecting device according to the first preferred embodiment of the present invention, showing it further includes a hand push section.

Please refer to FIG. 5 that is an assembled front view showing a first variant of the first preferred embodiment of the present invention further includes a hand push section 24 provided on the body portion 21 of the fixing member 2. The hand push section 24 can be a protrusion downward projected from a lower side of the body portion 21. The hand push section 24 and the first push section 14 are preferably directed to the same direction. In FIG. 5, the hand push section 24 and the first push section 14 are illustrated as directing downward. With this arrangement, a user may conveniently move the actuating retainer 1 toward the fixing member 2 by pressing one finger, such as the thumb, against an axially outer side (i.e. the left side in the drawing) of the first push section 14 while pressing another finger, such as the index finger, against an axially outer side (i.e. the right side in the drawing) of the hand push section 24.

Figure 6:
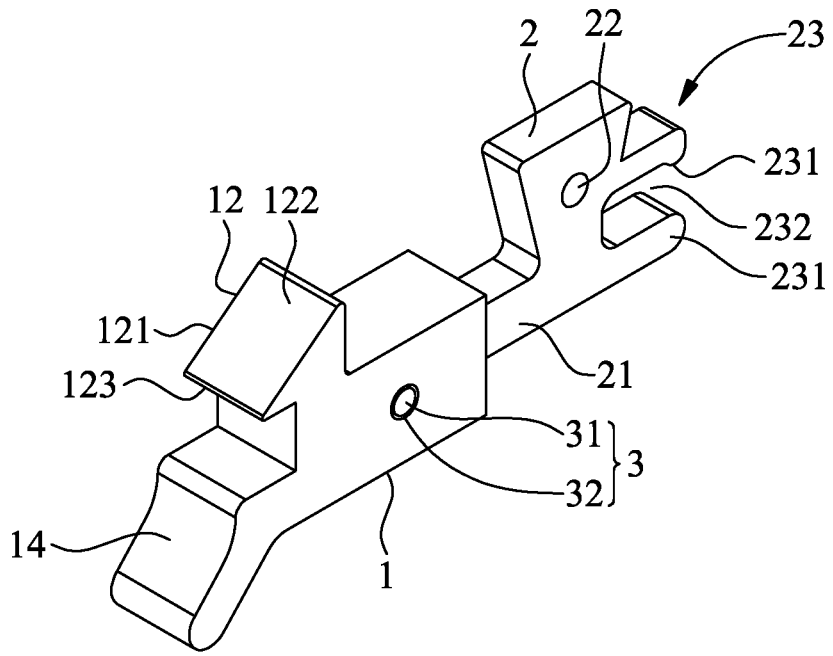
FIG. 6 is an assembled perspective view of a second variant of the first preferred embodiment of the present invention.
Figure 7:
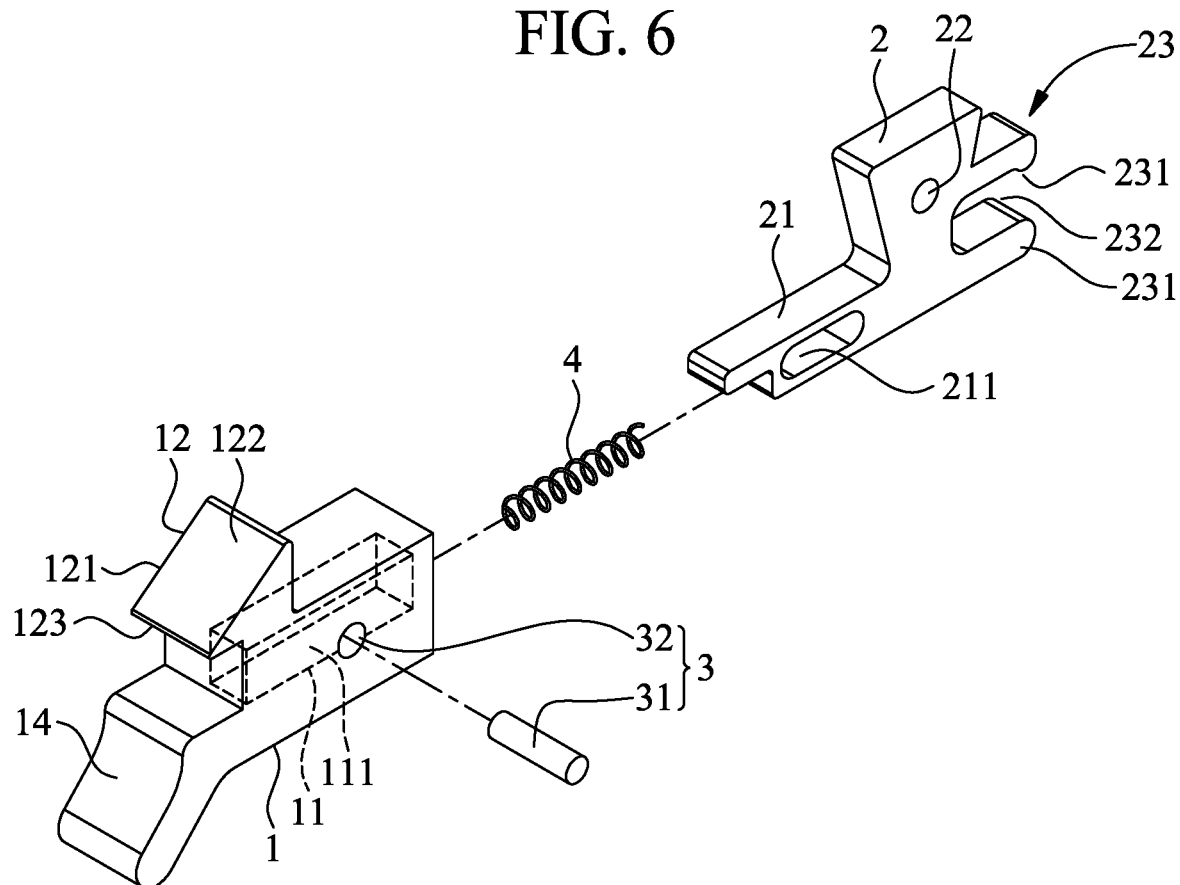
FIG. 7 is an exploded view of FIG. 6.
Figure 8:
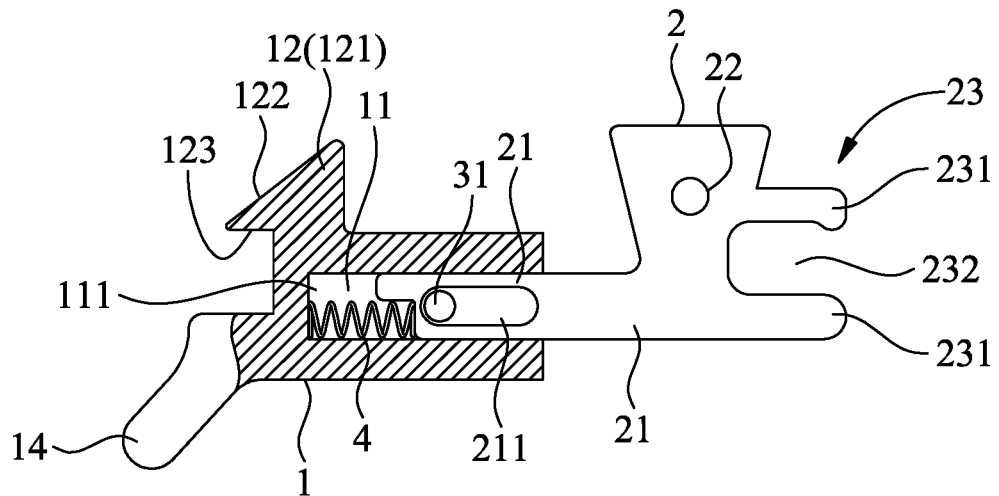
FIG. 8 is a partially sectioned front view of FIG. 6.
Figure 9:
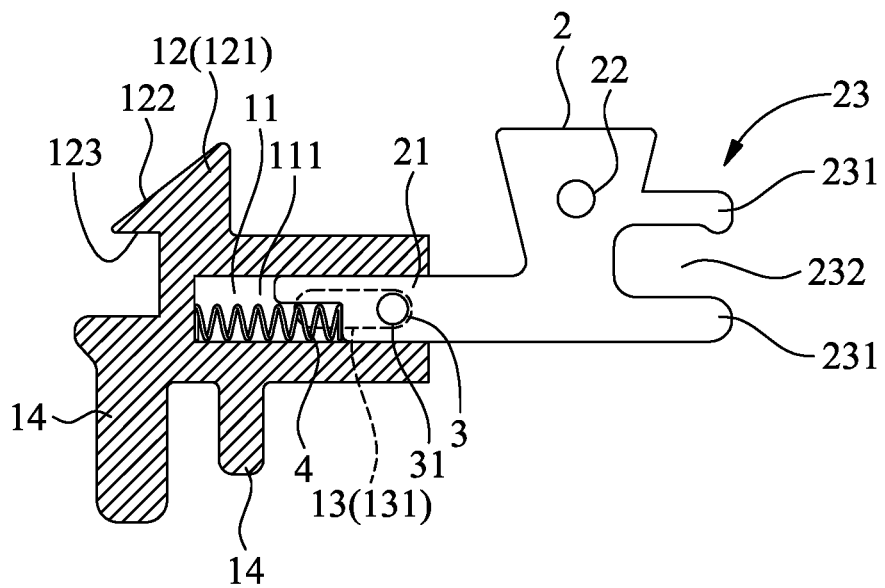
FIG. 9 is a partially sectioned front view of a third variant of the first preferred embodiment of the present invention, showing two first push sections are included in the quick release connecting device.

Please refer to FIGS. 1 to 4, in which the quick release connecting device according to the first preferred embodiment of the present invention is shown. As shown, in the first preferred embodiment, the actuating retainer 1 and the fixing member 2 are held to each other via the pin connection means 3 to allow limited sliding of them relative to each other, and accordingly, the retaining section 12 is slidably engaged with or released from the first object 5. More specifically, the actuating retainer 1 is internally provided with a pin connection slot 13, which communicates with the receiving space 11, and the pin connection means 3 is located in the pin connection slot 13. The pin connection slot 13 can be a long slide slot 131 formed on one or two lateral walls of the receiving space 11. When the pin connection means 3 slides in the long slide slot 131, the actuating retainer 1 and the fixing member 2 are brought to slide relative to each other within a limited range. FIGS. 6 to 8 show a second variant of the quick release connecting device according to the first preferred embodiment of the present invention. In the second variant, the body portion 21 of the fixing member 2 is formed with a long slide hole 211, which is communicable with the receiving space 11, and the pin connection means 3 is slidable in the long slide hole 211 to thereby bring the actuating retainer 1 and the fixing member 2 to slide relative to each other within a limited range.

Please refer to FIGS. 10 to 12, in which the quick release connecting device according to the second preferred embodiment of the present invention is shown. As shown, in the second preferred embodiment, the actuating retainer 1 and the fixing member 2 are held to each other via the pin connection means 3 to allow limited rotating of them relative to each other, and accordingly, the retaining section 12 is rotatably engaged with or released from the first object 5. More specifically, the actuating retainer 1 is also internally provided with a pin connection slot 13, which communicates with the receiving space 11, and the pin connection means 3 is located in the pin connection slot 13. According to an operable embodiment, the pin connection slot 13 can be a locating hole 132 formed on one or two lateral walls of the receiving space 11. When the pin connection means 3 rotates in the locating hole 132, the actuating retainer 1 and the fixing member 2 are brought to rotate relative to each other within a limited angle.

Figure 2:
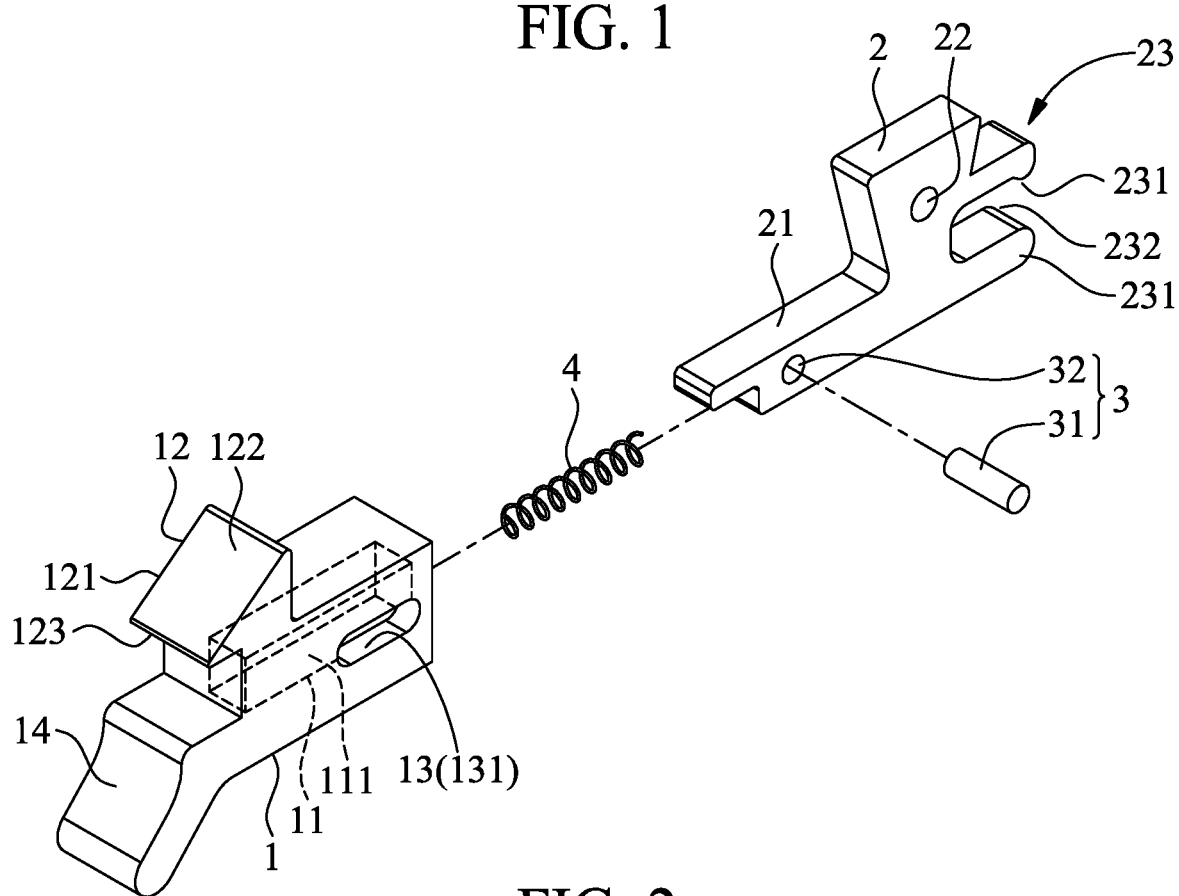
FIG. 2 is an exploded view of FIG. 1.
Figure 3:
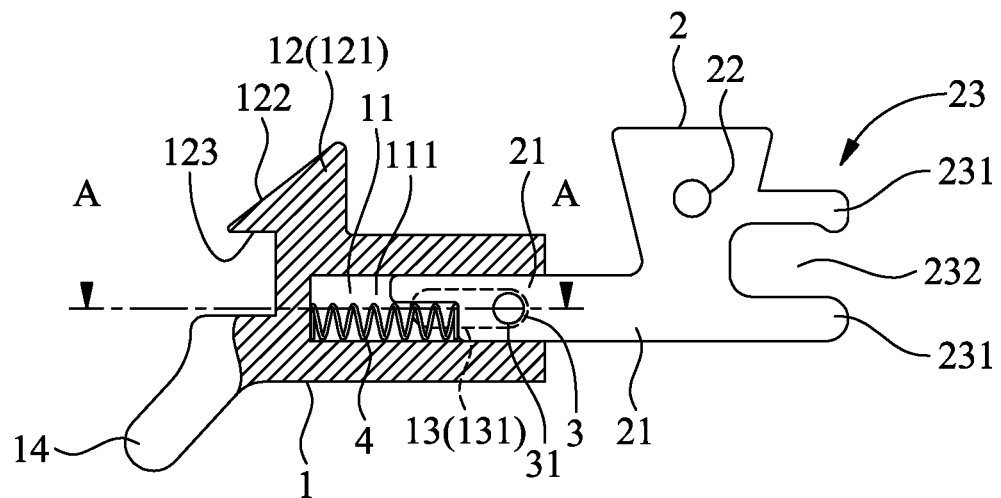
FIG. 3 is a partially sectioned front view of FIG. 1.
Figure 4:
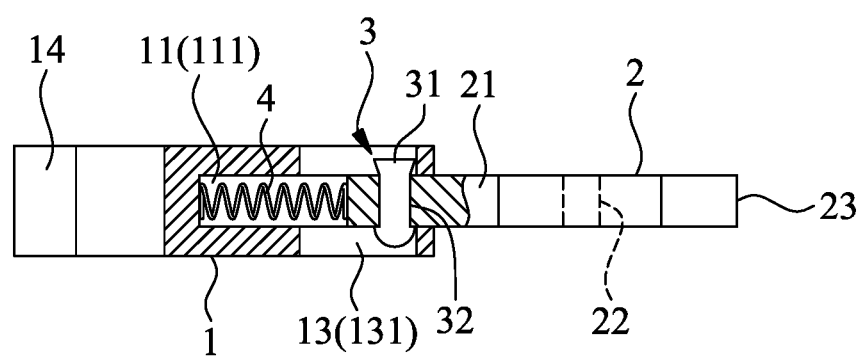
FIG. 4 is a sectional view taken along line A-A of FIG. 3.

In the first preferred embodiment, as can be seen in FIGS. 2 and 4, and in the second preferred embodiment, as can be seen in FIGS. 10 and 12, the pin connection means 3 can include a cylindrical pin 31 integrally formed with or additionally assembled to the body portion 21 of the fixing member 2, and a pin holding hole 32 formed on the body portion 21 of the fixing member 2. The cylindrical pin 31 is inserted in, snapped fitted in, riveted to, expansion-fitted in, glued to or screwed into the pin holding hole 32. Alternatively, the pin connection means 3 can include a cylindrical pin 31 integrally formed with or additionally assembled to the actuating retainer 1, and a pin holding hole 32 formed on the body portion 21 of the fixing member 2. Similarly, the cylindrical pin 31 is inserted in, snapped fitted in, riveted to, expansion-fitted in, glued to or screwed into the pin holding hole 32. By transversely and slidably setting the cylindrical pin 31 of the pin connection means 3 in the long slide slot 131 as in the first preferred embodiment, or by transversely and rotatably setting the cylindrical pin 31 of the pin connection means 3 in the locating hole 132 as in the second preferred embodiment, it is able to achieve the limited sliding or the limited rotation, respectively, of the actuating retainer 1 and the fixing member 2 relative to each other. Alternatively, in the second variant of the first preferred embodiment as shown in FIGS. 6 and 7, the pin connection means 3 includes a cylindrical pin 31 integrally formed with or additionally assembled to the actuating retainer 1 to transversely extend through the receiving space 11, and at least one pin holding hole 32 preferably formed on the actuating retainer 1 to communicate with the receiving space 11. Again, the cylindrical pin 31 is inserted in, snapped fitted in, riveted to, expansion-fitted in, glued to or screwed into the pin holding hole 32.

Please refer to FIGS. 1 to 12. In both of the first and the second preferred embodiment, the retaining section 12 on the actuating retainer 1 can be a hook 121 directed leftward (see FIGS. 1-11) or rightward (see FIG. 12) when viewing in front of the drawings. The hook 121 is preferably a triangular or wedge shaped hook protruded from the actuating retainer 1, and it includes a beveled guide surface 122 and a hooking surface 123 connected to a lower edge of the beveled guide surface 122. As can be seen in FIG. 13A, the beveled guide surface 122 allows the actuating retainer 1 to be conveniently pressed into the first object 5, and the hooking surface 123 can firmly abut on an inner side of the first object 5 after the beveled guide surface 122 has been moved into the first object 5.

In the first preferred embodiment shown in FIGS. 1 to 9, the fixing member 2 preferably includes at least one second push section 23. As illustrated in the drawings, the second push section 23 can be lying U-shaped to include two jaws 231 formed on an outer end thereof and a holding cavity 232 defined between the two jaws 231. Referring to FIG. 13A, the two jaws 231 and the holding cavity 232 of the second push section 23 can be used to hold the first object 5 thereto. When it is desired to release the second object 6 from the first object 5, simply turn the quick release connecting device as a lever to push the first object 5 out of the second push section 23, and the second object 6 can be easily released from the first object 5.

In the first preferred embodiment shown in FIGS. 1 to 9, the pivot portion 22 of the fixing member 2 is preferably a protruded block, a retaining block or a through hole integrally formed with or additionally assembled to the body portion 21. As shown in FIG. 13A, the quick release connecting device of the present invention can be movably connected to the second object 6 via the protruded block, the retaining block or the through hole. Preferably, the pivot portion 22 can be inserted in, snapped fitted onto, riveted to, expansion-fitted onto or screwed to the second object 6, so that the quick release connecting device and the second object 6 are rotatably connected to each other.

In the first preferred embodiment shown in FIGS. 1 to 9, the receiving space 11 in the actuating retainer 1 includes a straight and rectangular-sectioned slide space 111. The inner end of the body portion 21 of the fixing member 2 is extended into the slide space 111 and is slidably held therein via the pin connection means 3, so that the actuating retainer 1 and the fixing member 2 are able to slide relative to each other within a limited range. The elastic element 4 is preferably a coil spring, as shown in FIGS. 2 to 6, but it can also be an elastic plate or an elastic bar. The elastic element 4 is disposed in the slide space 111 with an end pressed against an inner wall surface of the slide space 111 and another end pressed against the body portion 21, such that the actuating retainer 1 and the fixing member 2 can slide relative to each other within a limited range and then return to their respective original position under the elastic force of the elastic element 4.

In the second preferred embodiment shown in FIGS. 10 to 12, the receiving space 11 in the actuating retainer 1 includes an arcuate slide space 112. The inner end of the body portion 21 of the fixing member 2 is extended into the arcuate slide space 112 and is rotatably held therein via the pin connection means 3, so that the actuating retainer 1 and the fixing member 2 are able to rotate relative to each other within a limited angle. The elastic element 4 is preferably a coil spring, as shown in FIG. 10, but it can also be an elastic plate as shown in FIG. 12 or an elastic bar (not shown). The elastic element 4 is disposed in the arcuate slide space 112 with an end pressed against an inner wall surface of the slide space 112 and another end pressed against the body portion 21, such that the actuating retainer 1 and the fixing member 2 can rotate relative to each other within a limited angle and then return to their respective original position under the elastic force of the elastic element 4.

Figure 13C:
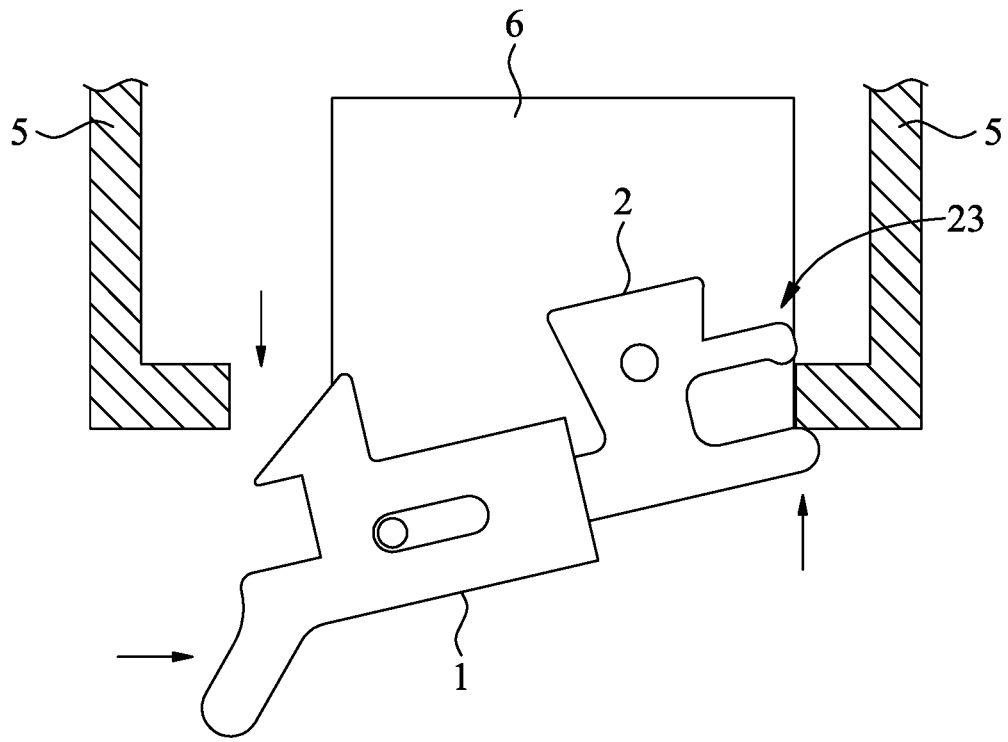
FIG. 13C shows the quick release connecting device according to the first preferred embodiment of the present invention is connected to two objects and can be operated to quickly release the two objects from each other.
Figure 13D:
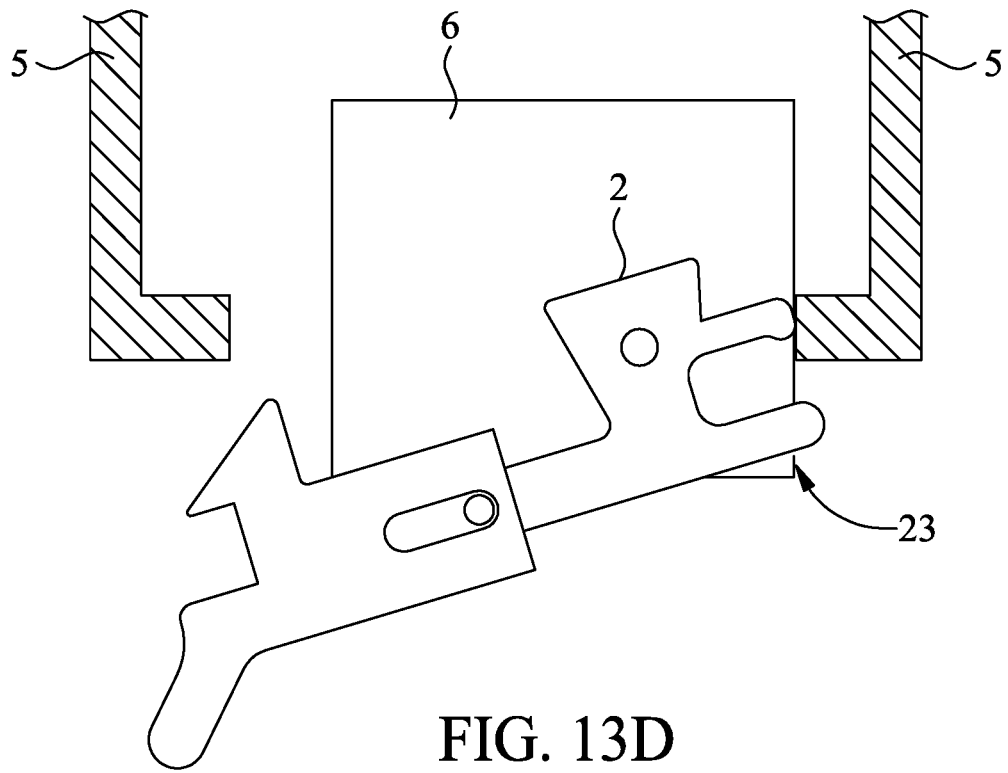
FIG. 13D shows the quick release connecting device according to the first preferred embodiment of the present invention is connected to two objects and can be operated to quickly release the two objects from each other.

The first object 5 can be a rack, a chassis, a cabinet for drawers, a window frame or other objects; and the second object 6 can be a circuit board, a drawer, a window or other objects. FIG. 13A shows the quick release connecting device according to the first preferred embodiment of the present invention is movably assembled to the second object 6 via the pivot portion 22 of the fixing member 2. Meanwhile, the retaining section 12 of the actuating retainer 1 and the second push section 23 of the fixing member 2 are detachably engaged with two opposite sides of the first object 5, so that the second object 6 is located in and sidewardly movably connected to the first object 5 via the quick release connecting device. When it is desired to separate the second object 6 from the first object 5, as indicated by FIG. 13B, simply push the first push section 14 of the actuating retainer 1 with one hand, so that the actuating retainer 1 slides toward the fixing member 2 by a limited range to separate the retaining section 12 from one side of the first object 5. Then, as shown in FIG. 13C, utilize the principle of leverage to push the quick release connecting device for the fixing member 2 to rotate about the pivot portion 22, bringing the second push section 23 to push the other side of the first object 5 away from it. At this point, the second object 6 can be pulled to slide out of the first object 5. Finally, as shown in FIG. 13D, when the second object 6 is separated from the first object 5 and the first push section 14 is no longer subjected to a push, the elastic element 4 automatically pushes the actuating retainer 1 to slide relative to the fixing member 5 back to its original position.

Figure 14A:
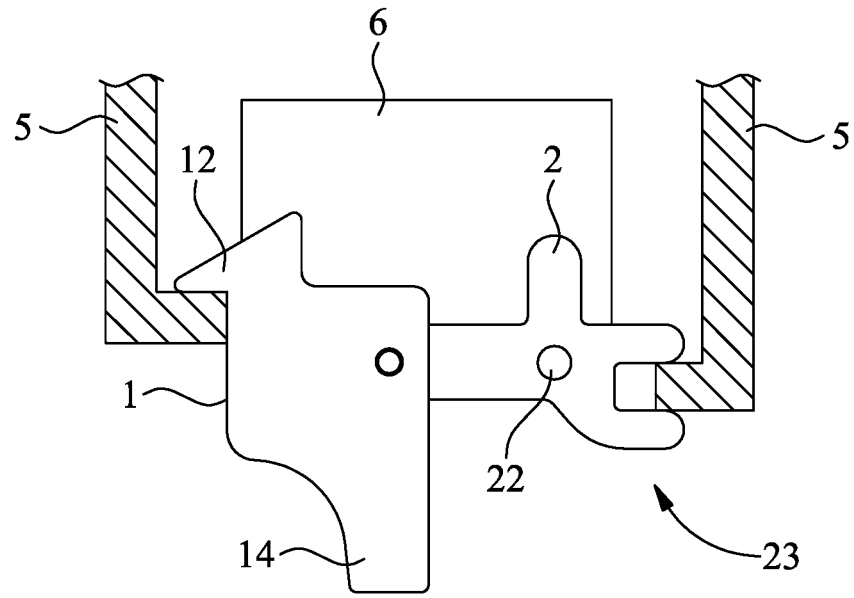
FIG. 14A shows the quick release connecting device according to the second preferred embodiment of the present invention is connected to two objects and can be operated to quickly release the two objects from each other.
Figure 14B:
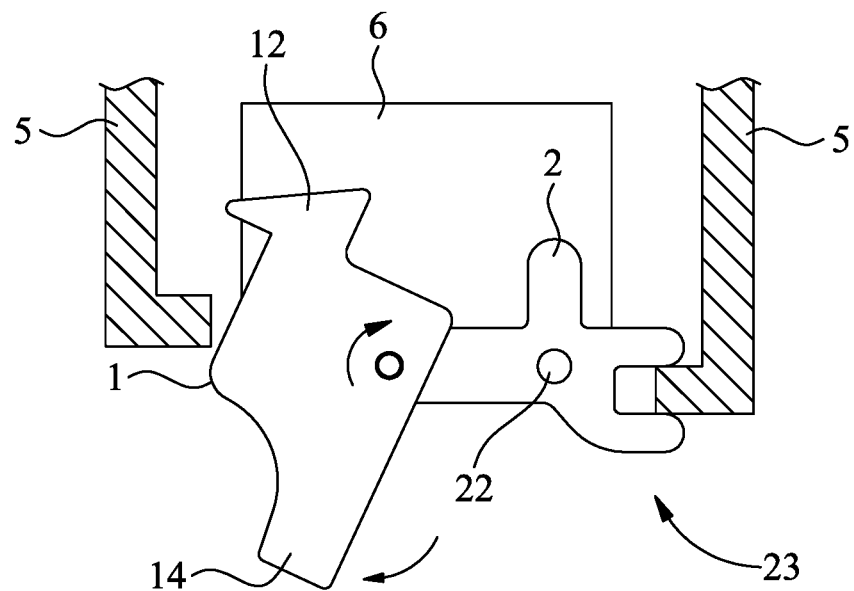
FIG. 14B shows the quick release connecting device according to the second preferred embodiment of the present invention is connected to two objects and can be operated to quickly release the two objects from each other.
Figure 14C:
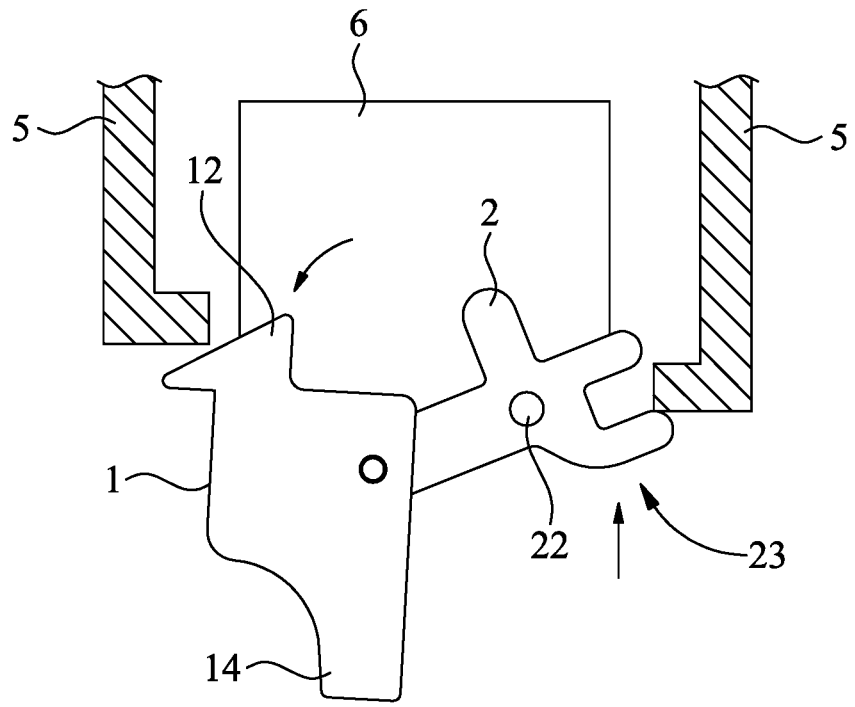
FIG. 14C shows the quick release connecting device according to the second preferred embodiment of the present invention is connected to two objects and can be operated to quickly release the two objects from each other.
Figure 14D:
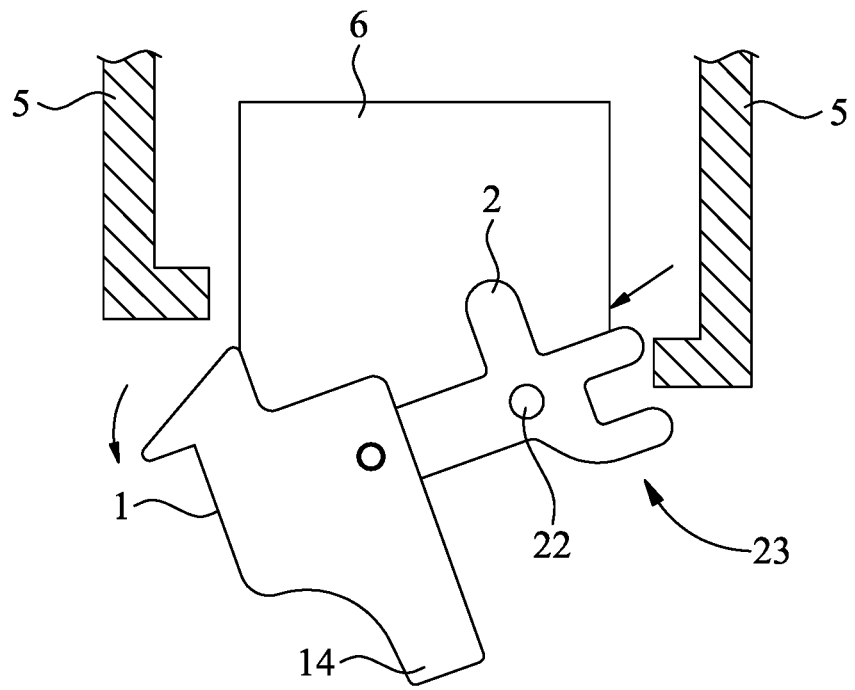
FIG. 14D shows the quick release connecting device according to the second preferred embodiment of the present invention is connected to two objects and can be operated to quickly release the two objects from each other.

FIG. 14A shows the quick release connecting device according to the second preferred embodiment of the present invention is similarly movably assembled to the second object 6 via the pivot portion 22 of the fixing member 2. Meanwhile, the retaining section 12 of the actuating retainer 1 and the second push section 23 of the fixing member 2 are detachably engaged with two opposite sides of the first object 5, so that the second object 6 is located in and sidewardly movably connected to the first object 5 via the quick release connecting device. When it is desired to separate the second object 6 from the first object 5, as indicated by FIG. 14B, simply push the first push section 14 of the actuating retainer 1 with one hand, so that the actuating retainer 1 rotates relative to the fixing member 2 by a limited angle to separate the retaining section 12 from one side of the first object 5. Then, as shown in FIG. 14C, utilize the principle of leverage to push the quick release connecting device for the fixing member 2 to rotate about the pivot portion 22, bringing the second push section 23 to push the other side of the first object 5 away from it. At this point, the second object 6 can be pulled to slide out of the first object 5. Finally, as shown in FIG. 14D, when the second object 6 is separated from the first object 5 and the first push section 14 is no longer subjected to a push, the elastic element 4 automatically pushes the actuating retainer 1 to rotate relative to the fixing member 5 back to its original position.

Figure 15:
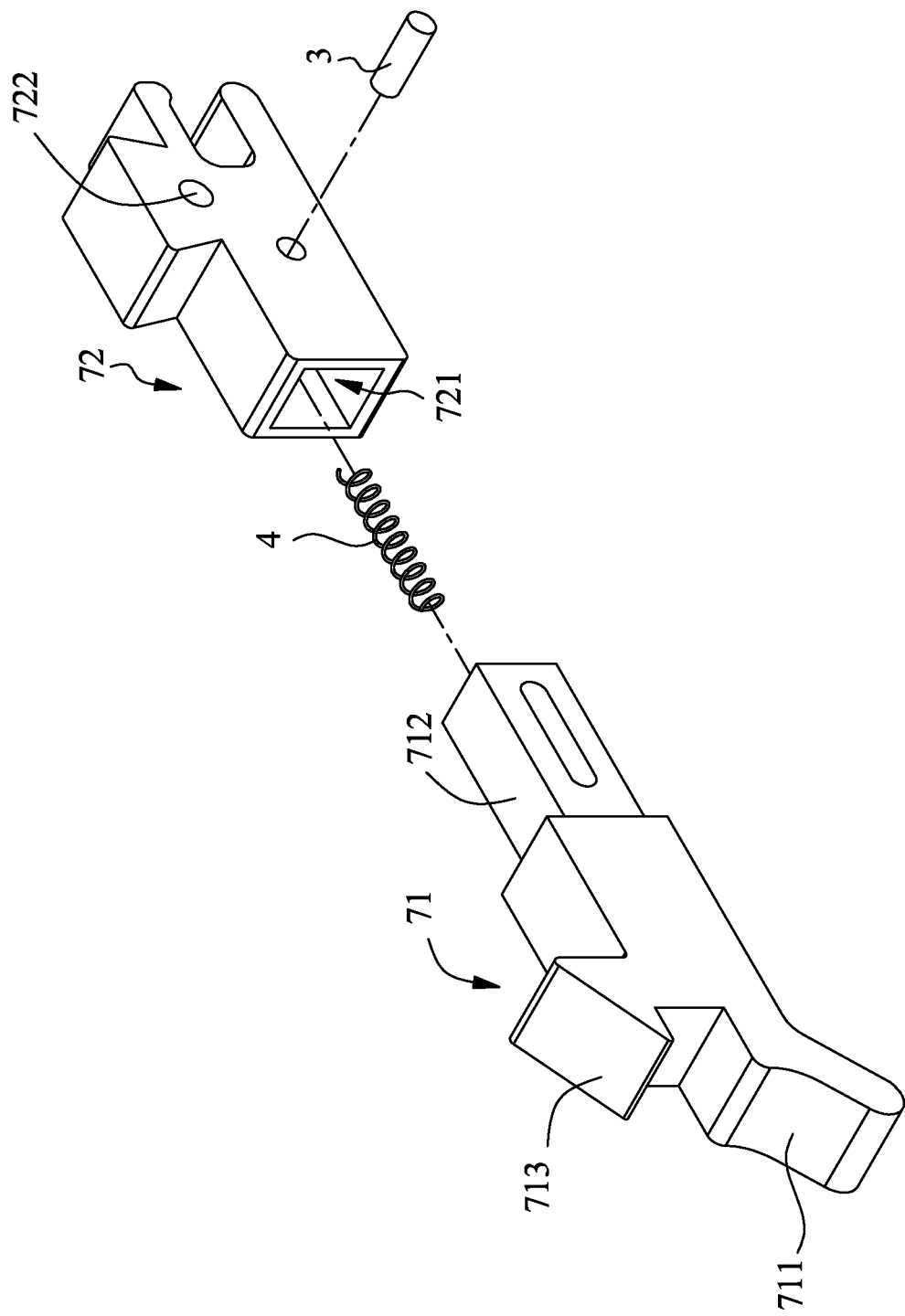
FIG. 15 is an exploded perspective view of a quick release connecting device according to a third preferred embodiment of the present invention.

Please refer to FIG. 15, which is an exploded perspective view of a quick release connecting device 7 according to a third preferred embodiment of the present invention. The quick release connecting device 7 includes an actuating retainer 71, a fixing member 72 movably assembled to the actuating retainer 71, and pin connection means 3. The actuating retainer 71 includes at least one first push section 711, a body portion 712, and a retaining section 713 for detachably engaging with a first object 5 (not shown in FIG. 15). The fixing member 72 internally defines a receiving space 721 and includes a pivot portion 722 formed on an outer side of the receiving space 721. The body portion 712 is movably received in the receiving space 721, and the pivot portion 722 is used to movably connect to a second object (not shown in FIG. 15). The pin connection means 3 enables connection of the receiving space 721 of the fixing member 72 to the body portion 712 of the actuating retainer 71, such that the actuating retainer 71 and the fixing member 72 are movable relative to each other within a limited range. The quick release connecting device 7 according to the third preferred embodiment of the present invention can further include an elastic element 4, which is disposed in the receiving space 721 with an end pressed against an inner wall surface of the receiving space 721 and another opposite end against the body portion 712. In this manner, the elastic element 4 enables and controls the limited movement of the actuating retainer 71 and the fixing member 72 relative to each other, and can elastically push the actuating retainer 71 and the fixing member 72 back to their original positions.

In addition, the retaining section 713 can be in the form of a hook, a recessed section, a protruded section, a stepped section, a flat surface, a cambered surface, or a curved surface.

Figure 16A:
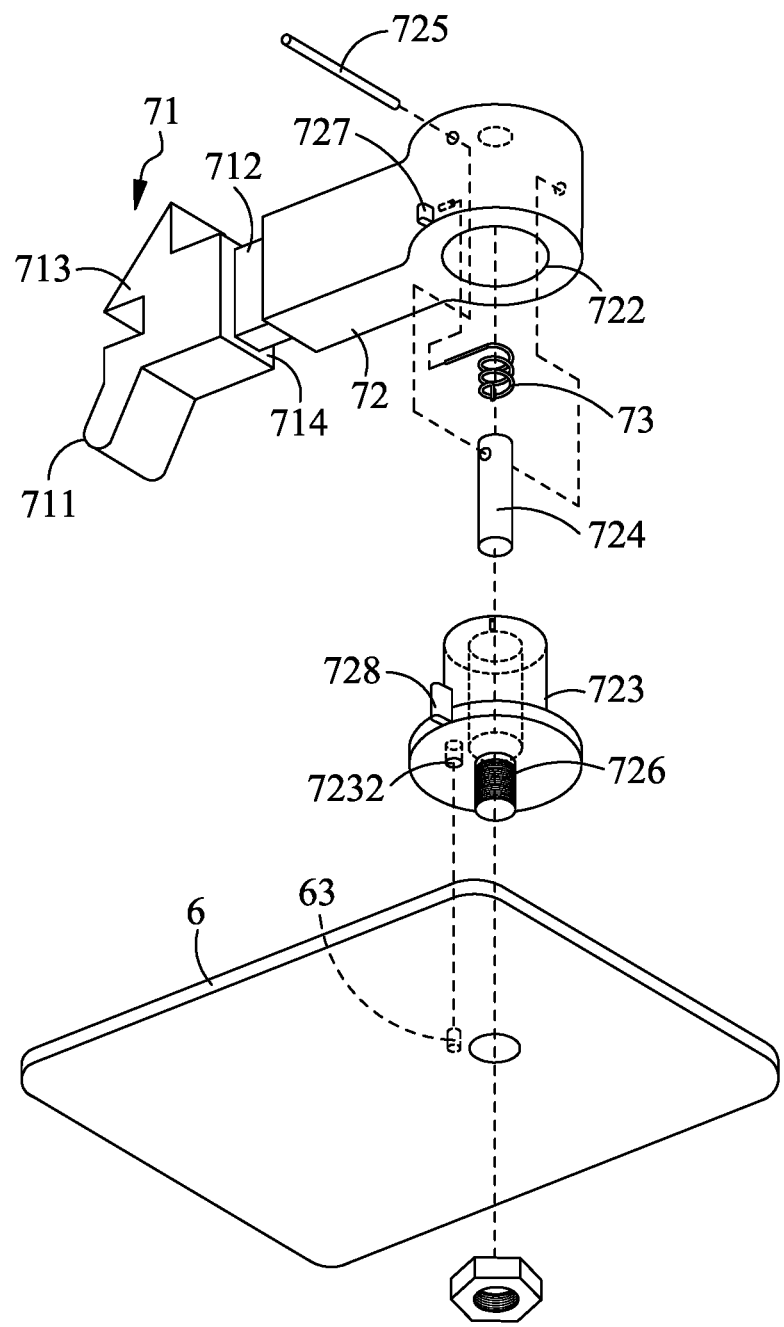
FIG. 16A is an exploded view of a quick release connecting device without the second push section according to a fourth preferred embodiment of the present invention.
Figure 16B:
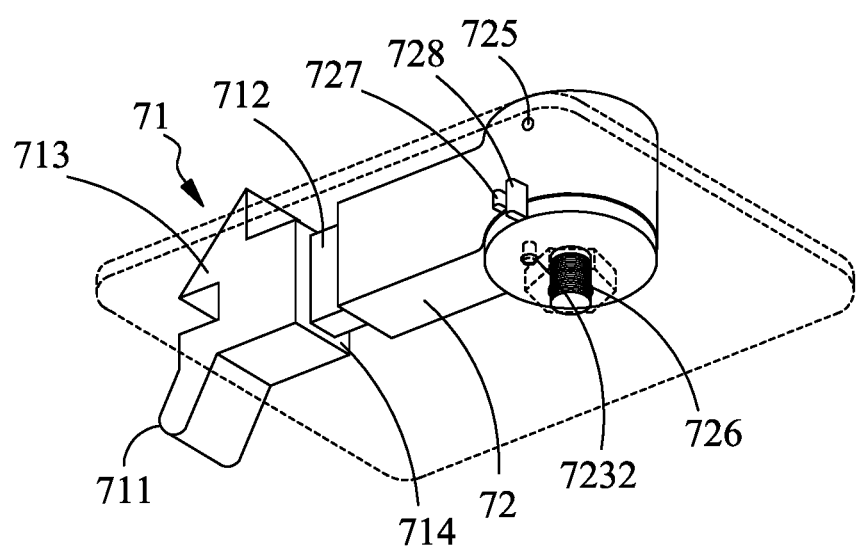
FIG. 16B is an assembled view of a quick release connecting device without the second push section according to a fourth preferred embodiment of the present invention.
Figure 16C:
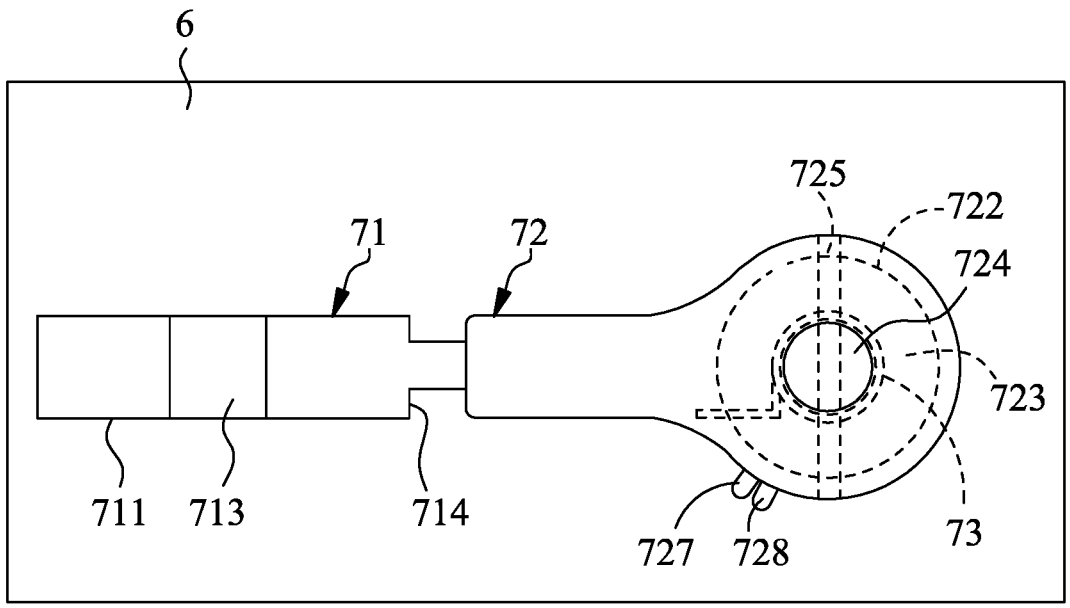
FIG. 16C is an assembled top view of a quick release connecting device without the second push section according to a fourth preferred embodiment of the present invention.

Please refer to FIGS. 16A-16C, which show a quick release connecting device 7 without the second push section according to a fourth preferred embodiment of the present invention. In the illustrated fourth preferred embodiment, the pivot portion 722 (please also refer to the pivot portion 722 shown in FIG. 15) has a pivot member 723 movably mounted thereto for coupling with the second object 6. The pivot member 723 includes a shaft 724 movably assembled thereto. The pivot member 723 (or the fixing member 72) and the shaft 724 are assembled together via a second pin connection means 725. An elastic element 73 is fitted on around the pivot portion 722 or the pivot member 723 with an end pressed against (or inserted into) the pivot member 723 (or a structure corresponding to the pivot member 723, such as a hole or a slot, not shown in the drawing) and another end pressed against the fixing member 72 of the quick release connecting device 7. The pivot member 723 includes a coupling section 726 for screwing onto, snap-fitted on, expansion-fitted on, welded to or riveted to the second object 6. Further, the fixing member 72 includes a limiting section 727 and the pivot member 723 includes a corresponding limiting section 728. When the fixing member 72 is moved or rotated, the limiting section 727 and the corresponding limiting section 728 can limit or stop each other at a specific location. The actuating retainer 71 or the body portion 712 thereof includes a shoulder section 714 for limiting a distance by which the actuating retainer 71 or the body portion 712 is allowed to move into the receiving space 721. Alternatively, the shaft 724 can be integrally formed with the pivot member 723 or the pivot portion 722, or can be fixedly assembled to the pivot member 723 or the pivot portion 722 (not shown).

The limiting section 727 or the corresponding limiting section 728 can be a beveled member, a flat member, a stepped member, a recessed member, or a protrusion. When the quick release connecting device 7 is turned by a target angle, the limiting section 727 and the corresponding limiting section 728 stop or limit each other and the quick release connecting device 7 can not be moved or rotated any further. The target angle can be, for example, ranged from 15 to 345 degrees.

Further, being driven by the elastic element 73, which can be a spring providing a twisting force, the quick release connecting device 7 can automatically turn within an angle limited by between the limiting section 727 and the corresponding limiting section 728 to achieve an elastic restoring motion, or an elastic releasing motion, or an elastic fastening motion.

The quick release connecting device 7 can also be driven by the elastic element 73, which provides a twisting force, to float within a range limited by between the limiting section 727 and the corresponding limiting section 728, including horizontally linear floating, vertically linear floating, or pivotal floating. Herein, a horizontally linear floating amount and a vertically linear floating amount of the quick release connecting device 7 refer to a distance by which the fixing member 72 is horizontally and vertically linearly movable relative to the pivot member 723, respectively; and a pivotal floating amount of the quick release connecting device 7 refers to an angle or a distance by which the fixing member 72 or the actuating retainer 71 is pivotally turnable between two different angularly spaced positions (not shown in FIG. 16).

In addition, the first push section 711 can be in the form of a post, a hole, a recessed member, a protrusion, a retaining member, a stepped member, an anti-slide member, a flat member, a cambered member, or a hooking member.

Figure 17:
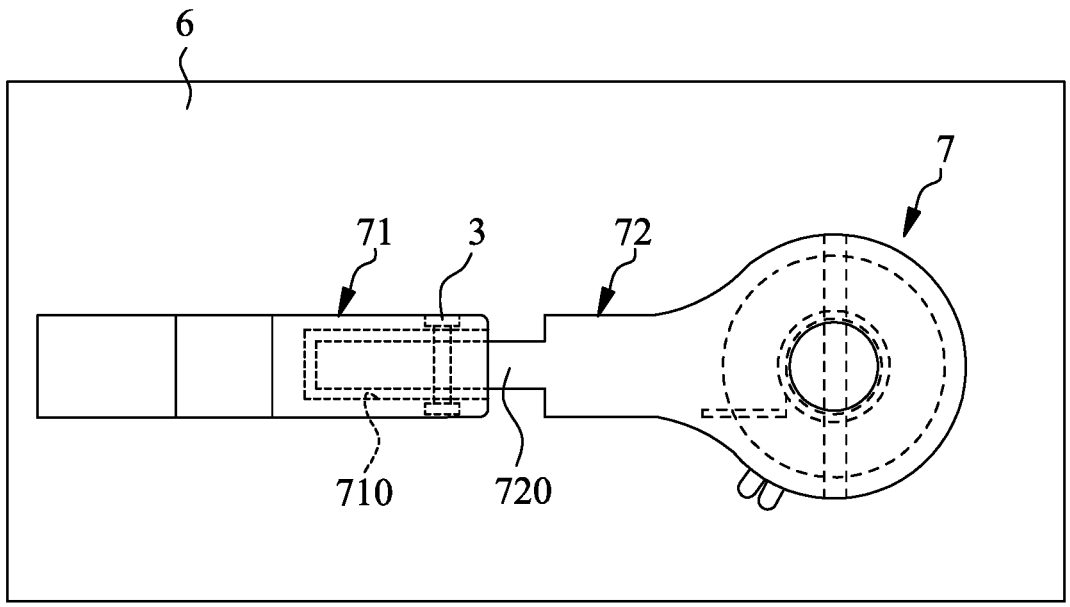
FIG. 17 is an assembled top view of a quick release connecting device without the second push section according to a fifth preferred embodiment of the present invention.

Please refer to FIG. 17, which shows a quick release connecting device 7 without the second push section according to a fifth preferred embodiment of the present invention. In the illustrated fifth preferred embodiment, the actuating retainer 71 of the quick release connecting device 7 internally defines a receiving space 710, and the fixing member 72 includes a body portion 720 movably received in the receiving space 710; and the pin connection means 3 enables connection of the receiving space 710 of the actuating retainer 71 to the body portion 720 of the fixing member 72, such that the actuating retainer 71 and the fixing member 72 are movable relative to each other within a limited range.

Figure 18:
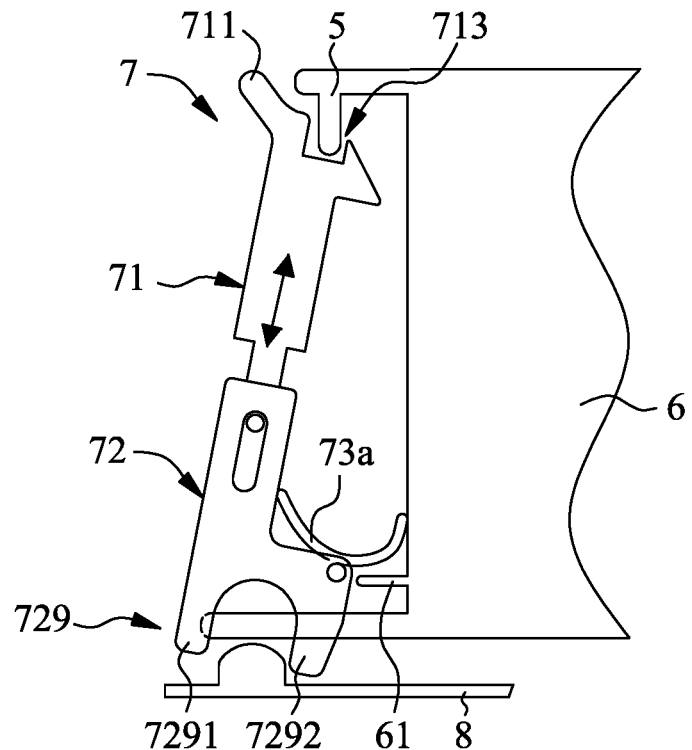
FIG. 18 shows a quick release connecting device according to a sixth preferred embodiment of the present invention.
Figure 19:
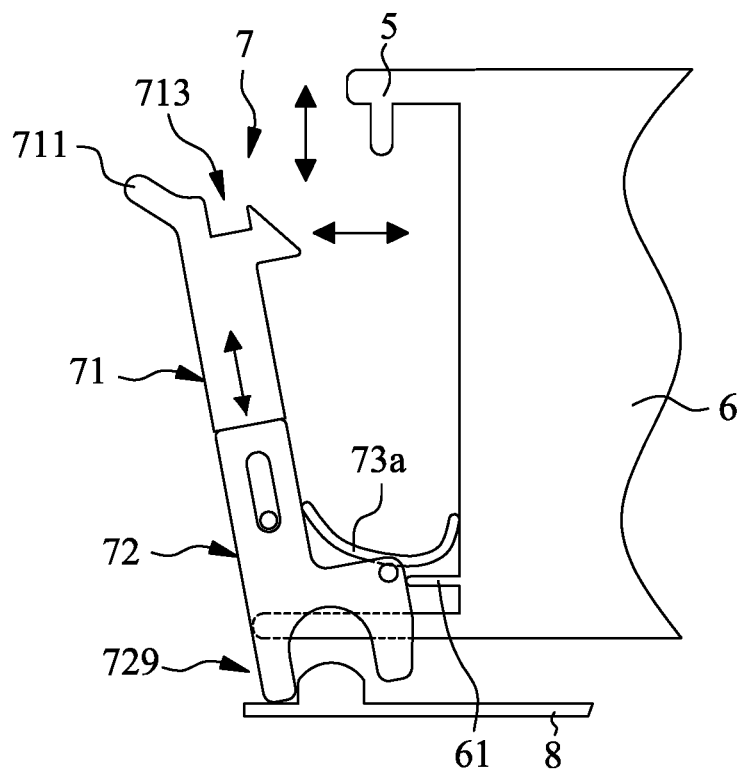
FIG. 19 shows a quick release connecting device according to a sixth preferred embodiment of the present invention.

Please refer to FIGS. 18 and 19, which show a quick release connecting device 7 according to a sixth preferred embodiment of the present invention. In the illustrated sixth preferred embodiment, the first object 5 and the second object 6 can be integrally formed, assembled together, or two independent objects; the second object 6 can be assembled to a fourth object 9 to form a modular object; or the quick release connecting device 7 and the second object 6 can be assembled together to form a module with an elastic element 73a pressing an end against the fixing member 72 of the quick release connecting device 7 and another end against the second object 6, such that the fixing member 72 under a spring force of the elastic element 73a is either automatically sprung back to its original position or limited to a fixed position. The fixing member 72 includes a second push section 729 having a first push part 7291 and a second push part 7292. The first push part 7291 or the second push part 7292 can be pressed against a third object 8. The pressing of the second push section 729 against the third object 8 causes a lever displacement, a rotational displacement or a limiting displacement of the quick release connecting device 7, so as to release, fasten, forward move or backward move the quick release connecting device 7. Alternatively, the first push part 7291 or the second push part 7292 can also be displaced by pressing them against the third object 8. The second object 6 includes a limiting section 61 for limiting a distance or an angle by which the second push section 729 can be moved or rotated, respectively. Or, in practical use of the quick release connecting device 7 according to the sixth preferred embodiment, the first push part 7291 and the second push part 7292 can be first subjected to a rotational or a non-rotational displacement to be located at a proper position in front of or behind or at a middle of a position on the third object 8 that is to be pressed against or interfered with, so that the first push part 7291 or the second push part 7292 of the second push section 729 having been rotationally or non-rotationally displaced can press against or interfere with the third object 8, enabling the quick release connecting device 7 to be released, fastened, forward moved or backward moved due to a lever displacement, a rotational displacement or a limiting displacement thereof.

In addition, the second push section 729 can be in the form of a protruded section, a recessed section, a through bore, a stepped section, a flat section, a cambered section or a curved section.

Further, when operating the first push section 711 of the actuating retainer 71 to compress the first push section 711 toward the fixing member 72, an overall travel of the quick release connecting device 7 is shortened, enabling the retaining section 713 to separate from the first object 5 while pulls the second object 6.

Figure 20:
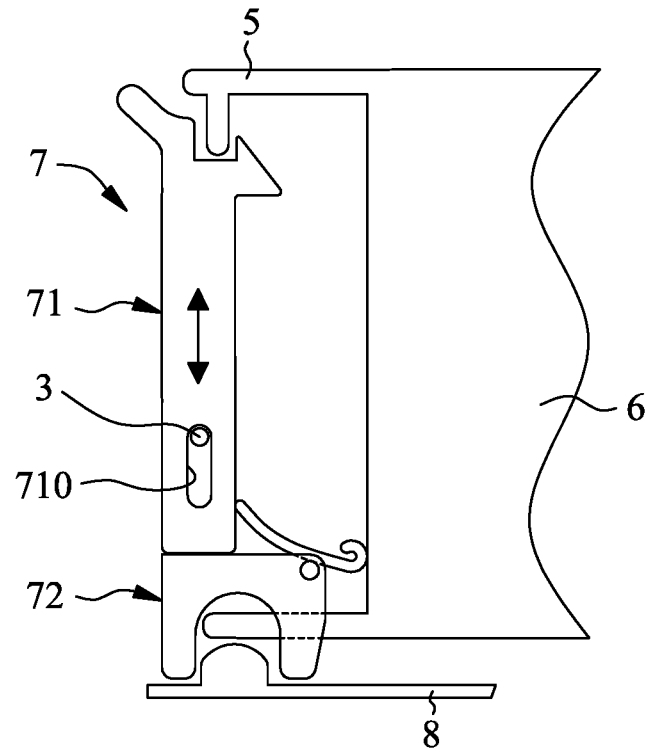
FIG. 20 shows a quick release connecting device according to a seventh preferred embodiment of the present invention.
Figure 21:
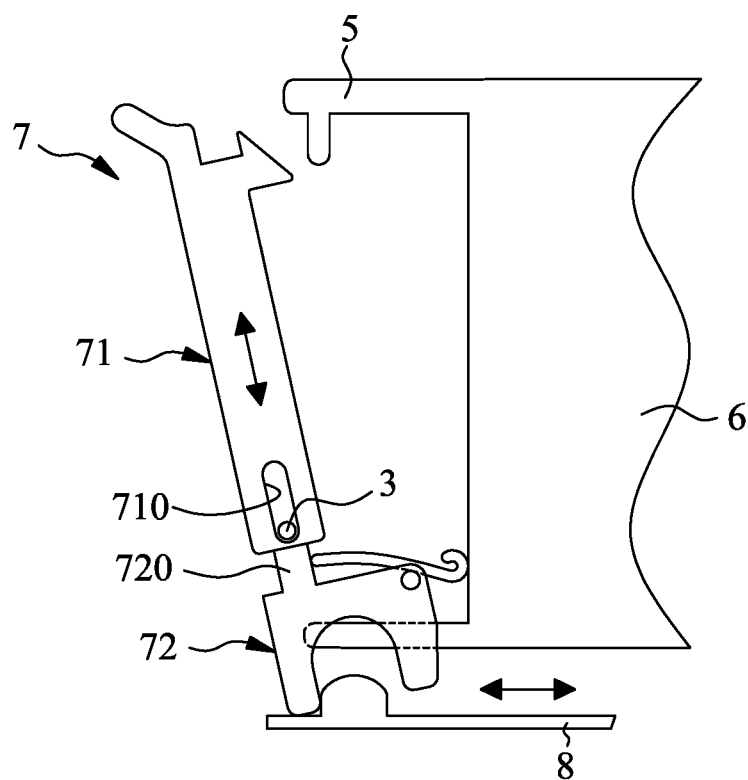
FIG. 21 shows a quick release connecting device according to a seventh preferred embodiment of the present invention.

Please refer to FIGS. 20 and 21, which show a quick release connecting device 7 according to a seventh preferred embodiment of the present invention. In the illustrated seventh preferred embodiment, the actuating retainer 71 of the quick release connecting device 7 defines a receiving space 710, and the fixing member 72 includes a body portion 720 movably received in the receiving space 710; and the pin connection means 3 enables connection of the receiving space 710 of the actuating retainer 71 to the body portion 720 of the fixing member 72, such that the actuating retainer 71 and the fixing member 72 are movable relative to each other within a limited range. Further, the elastic element (not shown) is disposed in the receiving space 710 with an end of the elastic element pressed against an inner wall surface of the receiving space 710 and another opposite end against the body portion 720. In this manner, the elastic element enables and controls the limited movement of the actuating retainer 71 and the fixing member 72 relative to each other, and can elastically push the actuating retainer 71 and the fixing member 72 back to their original positions. That is, the seventh preferred embodiment can achieve the same effect as the fifth preferred embodiment.

Figure 22:
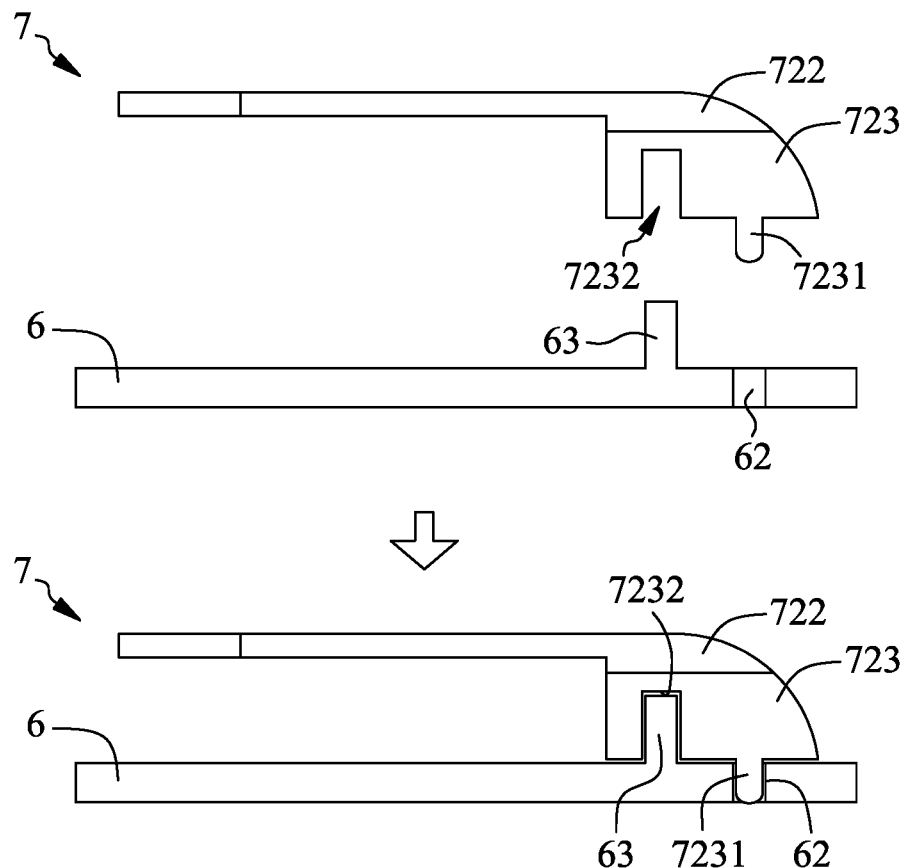
FIG. 22 shows a quick release connecting device without the second push section according to an eighth preferred embodiment of the present invention.
Figure 23:
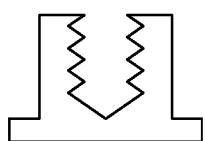
FIG. 23 shows different configurations available for a mounting section provided on a second object, which is to be connected to the quick release connecting device according to the eighth preferred embodiment of the present invention.
Figure 23:
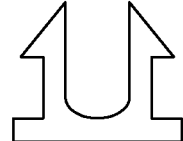
Figure 23:
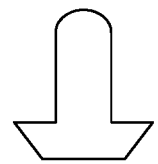
Figure 23:
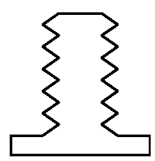
Figure 23:
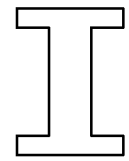

Please refer to FIG. 22, which shows a quick release connecting device 7 without the second push section according to an eighth preferred embodiment of the present invention, and to FIG. 23, which shows different configurations available for a mounting section 62 provided on a second object 6, which is to be connected to the quick release connecting device 7 according to the eighth preferred embodiment of the present invention. In the illustrated eighth preferred embodiment, the second object 6 can be a printed circuit board (PCB), a metal chassis, or a plastic chassis, and is provided with a mounting section 62 and a corresponding directional section 63. According to the eighth preferred embodiment, the mounting section 62 can be differently configured as a post or a hole. In the illustrated eighth preferred embodiment, the pivot member 723 of the quick release connecting device 7 is provided with a coupling section 7231 for coupling with the mounting section of the second object 6 and a directional section 7232 for engaging with the corresponding directional section 63 of the second object 6 to limit the pivot member 723 to specific directions or to restrict the pivot member 723 from rotating or moving.

According to the eighth preferred embodiment, the coupling section 7231 can be in the form of a threaded member, a male fastening element, a female fastening element, a protrusion, a recessed member, a spring plate, a groove, a plate member, a post, a hooking member, a nut, a retaining member, or a hole; the directional section 7232 or the corresponding directional section 63 can be in the form of a hole, a groove, a threaded member, a male fastening element, a female fastening element, a protrusion, a recessed member, a spring plate, a plate member, a nut, a post, a hooking member, or a retaining member; and the mounting section 62 can be in the form of a threaded member, a male fastening element, a female fastening element, a spring plate, a groove, a protrusion, a recessed member, a plate member, a post, a hooking member, a nut, a retaining member, or a hole. In the illustrated eighth preferred embodiment, the mounting section 62 is in the form of a cylindrical hole.

Alternatively, the mounting section 62 can be an independent retaining member or coupling member for engaging with the second object 6 and the quick release connecting device 7. In this case, the independent mounting section 62 can be in the form of a nut as shown in FIG. 23(a), an elastic retaining member as shown in FIG. 23(b), a post as shown in FIG. 23(c), a screw as shown in FIG. 23(d), or a male fastening element as shown in FIG. 23(e).

Figure 24:
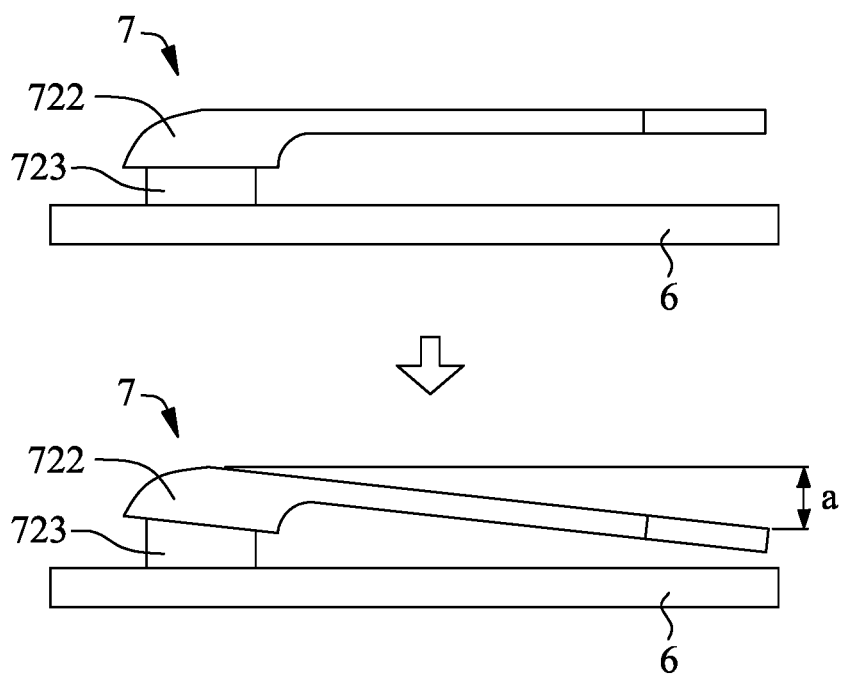
FIG. 24 shows a quick release connecting device without the second push section according to a ninth preferred embodiment of the present invention that allows for a vertically pivotal floating amount.
Figure 25:
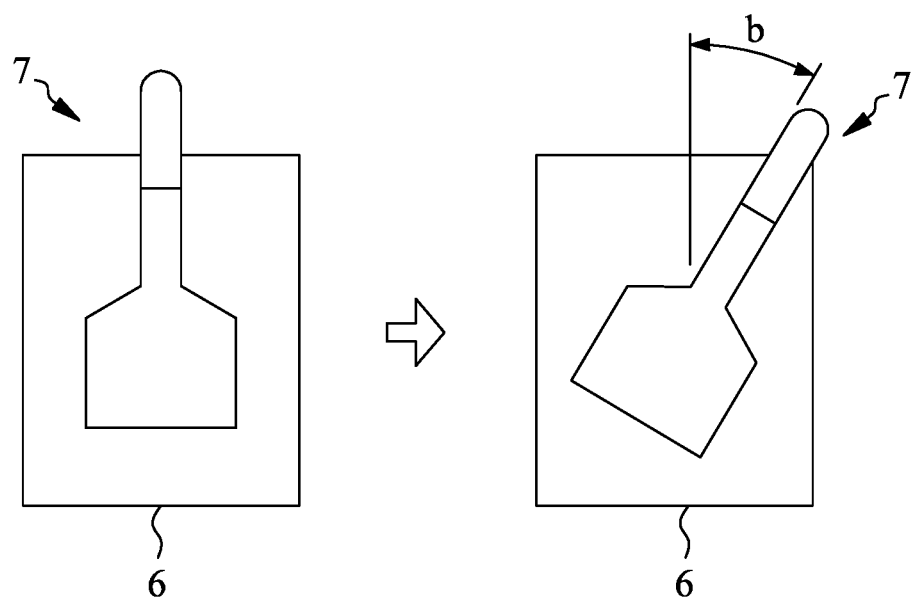
FIG. 25 shows the floating fixing member of the quick release connecting device without the second push section according to the ninth preferred embodiment of the present invention that allows for a horizontally pivotal floating amount.
Figure 26:
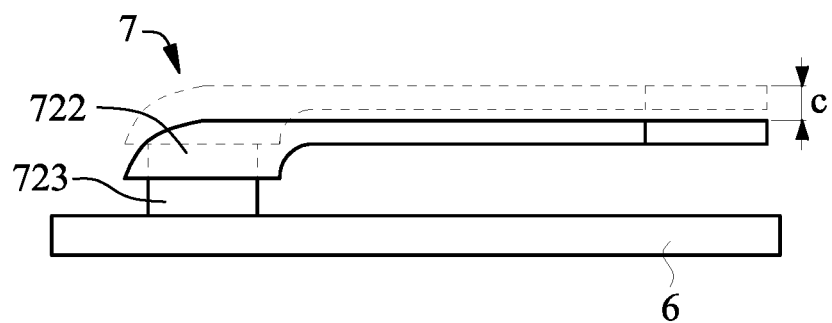
FIG. 26 shows the floating fixing member of the quick release connecting device without the second push section according to the ninth preferred embodiment of the present invention that allows for a vertically linear floating amount.
Figure 27:
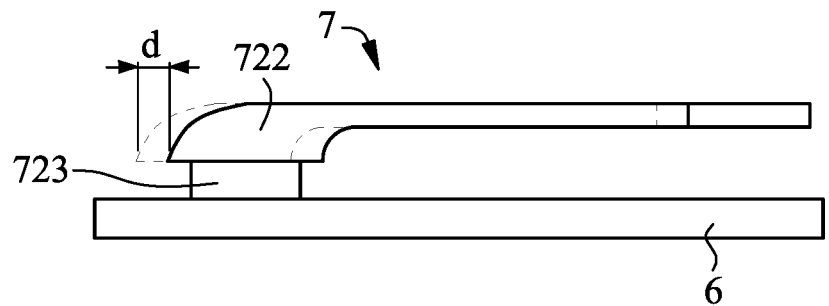
FIG. 27 shows the floating fixing member of the quick release connecting device without the second push section according to the ninth preferred embodiment of the present invention that allows for a horizontally linear floating amount.

Please refer to FIGS. 24 to 27, in which a quick release connecting device 7 without the second push section and having a floating fixing member 72 according to a ninth preferred embodiment of the present invention is shown. According to the ninth preferred embodiment, the pivot member 723 of the quick release connecting device 7 is connected to the second object 6, such that a floating amount is allowable between the quick release connecting device 7 and the second object 6, between the pivot portion 722 and the pivot member 723, between the fixing member 72 and the second object 6, between the fixing member 72 and the pivot member 723, or between different angular positions of the fixing member 72. The floating amount can be a vertically pivotal floating amount "a" as shown in FIG. 24; a horizontally pivotal floating amount "b" as shown in FIG. 25; a vertically linear floating amount "c" as shown in FIG. 26; or a horizontally linear floating amount "d" as shown in FIG. 27. With the allowable floating amount "a", "b", "c" or "d", the quick release connecting device 7 can be pivotally moved relative to the second object 6 in a vertical direction, be pivotally moved relative to the second object 6 in a horizontal direction, be linearly moved upward and downward relative to the second object 6 in a vertical direction, or be linearly moved forward and backward relative to the second object 6 in a horizontal direction, respectively. Preferably, the floating amount "a", "b", "c" or "d" is a distance ranged from 0.01 mm to 500 mm, and the floating amount "a" or "b" can be alternately an angle ranged from 0.1 to 345 degrees.

Figure 28:
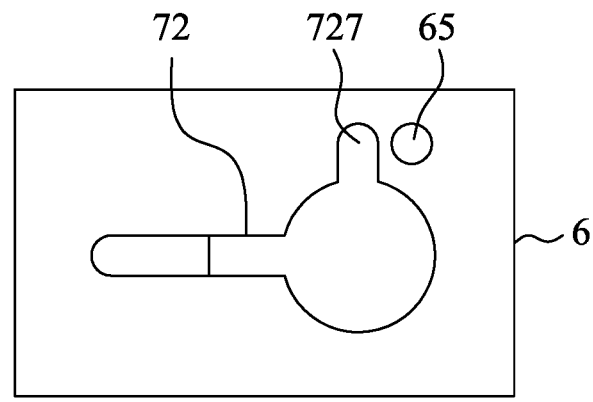
FIG. 28 shows a quick release connecting device without the second push section according to a tenth preferred embodiment of the present invention.

Please refer to FIG. 28, which shows a quick release connecting device 7 without the second push section according to a tenth preferred embodiment of the present invention. In the tenth preferred embodiment, the fixing member 72 of the quick release connecting device 7 includes a limiting section 727, and the second object 6 is provided with a corresponding limiting section 65. When the fixing member 72 is moved or turned, the limiting section 727 and the corresponding limiting section 65 can limit or stop each other at a specific location.

Figure 29:
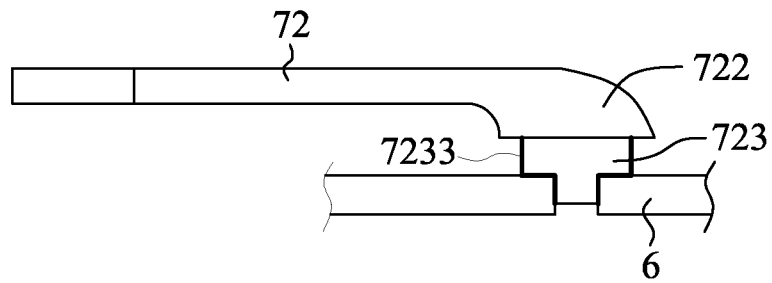
FIG. 29 shows a quick release connecting device without the second push section according to an eleventh preferred embodiment of the present invention.

Please refer to FIG. 29, which shows a quick release connecting device 7 without the second push section according to an eleventh preferred embodiment of the present invention. In the eleventh preferred embodiment, the pivot member 723 is movably mounted to the pivot portion 722 of the fixing member 72, and the pivot member 723 has a weldable surface 7233, which can be heated and welded to the second object 6. The weldable surface 7233 can be formed of tin, nickel, copper, chrome, iron or zinc; and the second object 6 can be a printed circuit board (PCB). Further, in this case, the second object 6 also has a weldable surface (not shown).

Figure 30:
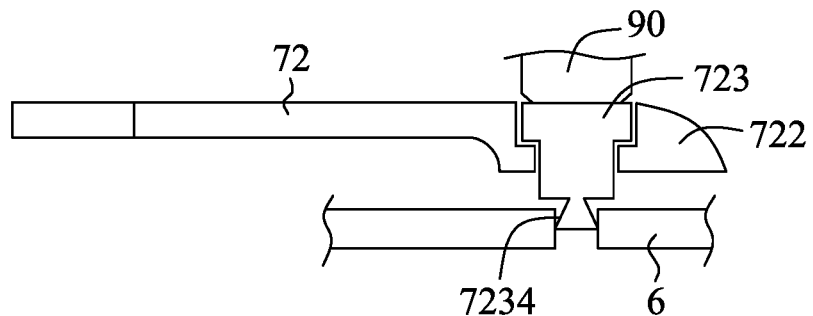
FIG. 30 shows a quick release connecting device without the second push section according to a twelfth preferred embodiment of the present invention.
Figure 30:
Figure 30:
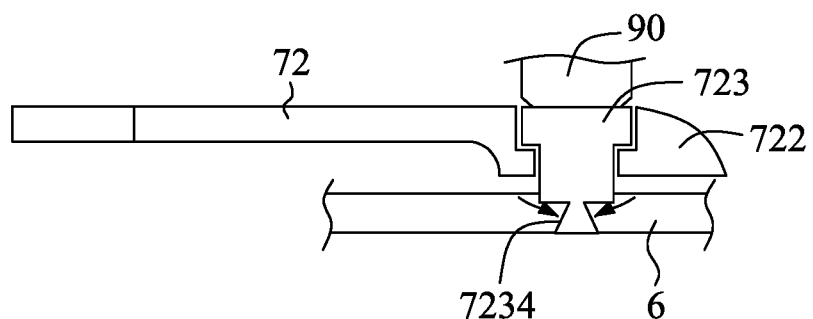

Please refer to FIG. 30, which shows a quick release connecting device without the second push section according to a twelfth preferred embodiment of the present invention. In the twelfth preferred embodiment, the pivot member 723 is movably mounted to the pivot portion 722 of the fixing member 72, and the pivot member 723 has a material retaining space formed thereon. When the pivot member 723 is press-fitted onto the second object 6 under an external force applied thereto, some material of the second object 6 is forced or flows into the material retaining space 7234. In this case, the pivot member 723 has a material hardness higher than that of the second object 6, and the external force can be applied to the pivot member 723 by a mold 90.

Figure 31:
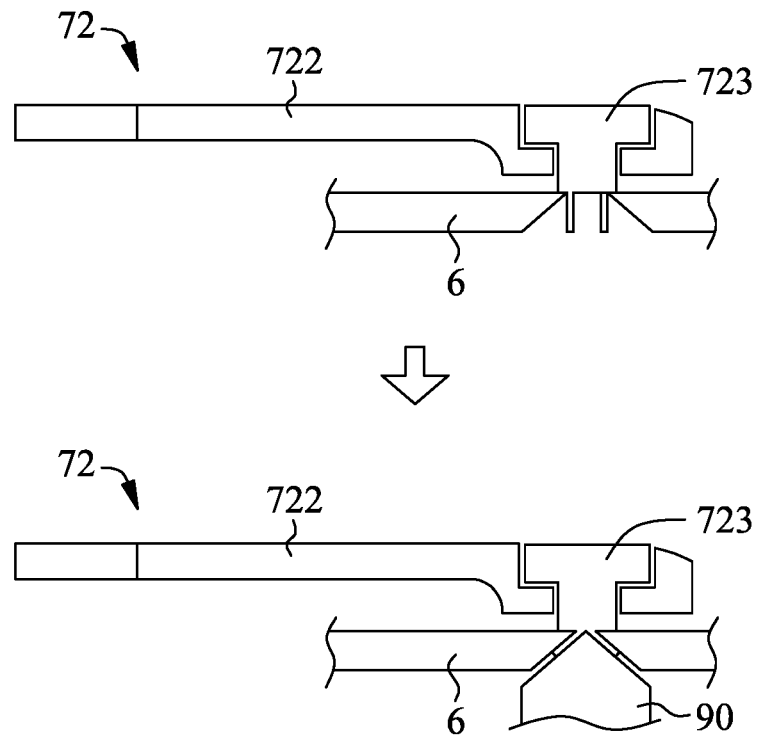
FIG. 31 shows a quick release connecting device without the second push section according to a thirteenth preferred embodiment of the present invention.

Please refer to FIG. 31, which shows a quick release connecting device without the second push section according to a thirteenth preferred embodiment of the present invention. In the thirteenth preferred embodiment, the pivot member 723 is movably mounted to the pivot portion 722 of the fixing member 72, and the pivot member 723 has a portion that is deformable under an external force applied thereto by a mold 90, so that the deformed portion of the pivot member 723 is abutted on or interfered with the second object 6.

Figure 32:
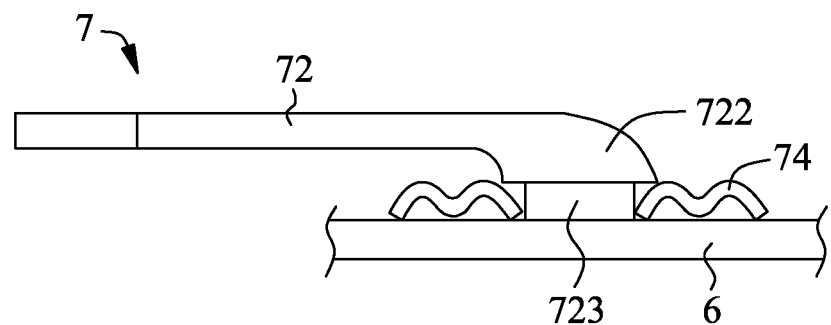
FIG. 32 shows a quick release connecting device without the second push section according to a fourteenth preferred embodiment of the present invention.

Please refer to FIG. 32, which shows a quick release connecting device without the second push section according to a fourteenth preferred embodiment of the present invention. In the fourteenth preferred embodiment, the pivot member 723 is movably mounted to the pivot portion 722 of the fixing member 72, and an elastic member 74, a friction-increasing member or a friction-decreasing member is disposed between the fixing member 72 and the pivot portion 722, between the fixing member 72 and the pivot member 723, between the pivot portion 722 and the second object 6, between the pivot portion 722 and the pivot member 723, between pivot member 723 and the second object 6, or between the fixing member 72 and the second object 6. The elastic member 74, the friction-increasing member or the friction-decreasing member can be in the form of a flat spring, a coil spring, an elastic bar, a torsion spring, a pillar, a plate member, a smooth flat member, or a smooth-surface member. The elastic member 74 provides a torsional force or a frictional force against the quick release connecting device 7 when the same is being moved, so as to limit the moving speed or the moving force of the quick release connecting device 7, or to limit or increase the vertically pivotal floating amount, the horizontally pivotal floating amount, the vertically linear floating amount, or the horizontally linear floating amount of the quick release connecting device 7.

The present invention has been described with some preferred embodiments thereof and it is understood that the preferred embodiments are only illustrative and not intended to limit the present invention in any way and many changes and modifications in the described embodiments can be carried out without departing from the scope and the spirit of the invention that is intended to be limited only by the appended claims.

What is claimed is:

1. A quick release connecting device, comprising an elastic member, an actuating retainer and a fixing member movably assembled to the actuating retainer; the fixing member including a pivot portion and a pivot member movably mounted to the pivot portion; and the pivot member being coupled with a second object; wherein the elastic member being disposed between the fixing member and the second object, an elastic force being perpendicular to the fixing member and the second object.

2. The quick release connecting device as claimed in claim 1, wherein the fixing member includes a limiting section and the pivot member includes a corresponding limiting section; and the limiting section and the corresponding limiting section limiting or stopping each other at a specific location when the fixing member is moved or rotated.

3. The quick release connecting device as claimed in claim 1, wherein one of the pivot member and the pivot portion includes a shaft; the shaft being differently connectable to the pivot member or the pivot portion in one of the following manners, including being movably assembled to, integrally formed with, and fixedly assembled to the pivot member or the pivot portion; and the pivot member, the pivot portion or the fixing member being connected to the shaft via a second pin connection means in the case the shaft is assembled to the pivot member or the pivot portion.

4. The quick release connecting device as claimed in claim 1, wherein the fixing member, the pivot portion or the pivot member has an elastic element fitted thereon; two ends of the elastic element being separately pressed against the pivot member and the fixing member of the quick release connecting device or separately pressed against the fixing member of the quick release connecting device and the second object, such that the fixing member under a spring force of the elastic element is either automatically sprung back to its original position or limited to a fixed position.

5. The quick release connecting device as claimed in claim 1, wherein the fixing member includes a limiting section and the second object includes a corresponding limiting section; and the limiting section and the corresponding limiting section limiting or stopping each other at a specific location when the fixing member is moved or rotated.

6. The quick release connecting device as claimed in claim 1, wherein the pivot member has a weldable surface, which can be heated and welded to the second object.

7. The quick release connecting device as claimed in claim 1, wherein the pivot member has a portion that is deformable under an external force applied thereto, so that the deformed portion of the pivot member is abutted on or interfered with the second object.

8. A quick release connecting device, comprising an actuating retainer and a fixing member movably assembled to the actuating retainer; the fixing member including a pivot portion and a pivot member movably mounted to the pivot portion; and the pivot member being coupled with a second object; wherein the pivot member having a directional section for engaging with a corresponding directional section of the second object to limit the pivot member to specific directions or to restrict the pivot member from rotating or moving; wherein the pivot member including a coupling section for screwing onto the second object.

9. A quick release connecting device, comprising an actuating retainer and a fixing member movably assembled to the actuating retainer; the fixing member including a pivot portion and a pivot member movably mounted to the pivot portion; and the pivot member being coupled with a second object; one of the pivot portion and the pivot member including a shaft, and the shaft being differently connectable to the pivot member or the pivot portion in one of the following manners, including being movably assembled to, integrally formed with, and fixedly assembled to the pivot member or the pivot portion; wherein the pivot member, the pivot portion or the fixing member is connected to the shaft via a second pin connection means in the case the shaft is assembled to the pivot member or the pivot portion.

10. A quick release connecting device, comprising an elastic member, an actuating retainer and a fixing member movably assembled to the actuating retainer; the fixing member including a pivot portion and a pivot member movably mounted to the pivot portion; and the pivot member being coupled with a second object; one of the pivot portion and the pivot member including a shaft, and the shaft being differently connectable to the pivot member or the pivot portion in one of the following manners, including being movably assembled to, integrally formed with, and fixedly assembled to the pivot member or the pivot portion; wherein the elastic member being disposed between the fixing member and the second object, an elastic force being perpendicular to the fixing member and the second object.

11. A quick release connecting device, comprising an elastic member, an actuating retainer and a fixing member movably assembled to the actuating retainer; the fixing member including a pivot portion and a pivot member movably mounted to the pivot portion; and the pivot member being coupled with a second object; one of the pivot portion and the pivot member including a shaft, and the shaft being differently connectable to the pivot member or the pivot portion in one of the following manners, including being movably assembled to, integrally formed with, and fixedly assembled to the pivot member or the pivot portion; wherein the pivot member having a directional section for engaging with a corresponding directional section of the second object to limit the pivot member to specific directions or to restrict the pivot member from rotating or moving; wherein the pivot member including a coupling section for screwing onto the second object.

\* \* \* \* \*